(12) United States Patent
Chen et al.

(10) Patent No.: US 10,756,643 B2
(45) Date of Patent: Aug. 25, 2020

(54) FLIPPING-CAPACITOR RECTIFIER CIRCUIT

(71) Applicant: University of Macau, Macau (CN)

(72) Inventors: Zhiyuan Chen, Macau (CN); Man-Kay Law, Macau (CN); Pui-In Mak, Macau (CN); Rui Paulo da Silva Martins, Macau (CN)

(73) Assignee: UNIVERSITY OF MACAU, Macau (CN)

( * ) Notice: Subject to any disclaimer, the term of this patent is extended or adjusted under 35 U.S.C. 154(b) by 375 days.

(21) Appl. No.: 15/821,862

(22) Filed: Nov. 24, 2017

(65) Prior Publication Data

US 2019/0165688 A1    May 30, 2019

(51) Int. Cl.
| | | |
|---|---|---|
| *H01L 41/04* | (2006.01) | |
| *H02M 7/06* | (2006.01) | |
| *H02M 7/217* | (2006.01) | |

(52) U.S. Cl.
CPC .......... *H02M 7/066* (2013.01); *H01L 41/042* (2013.01); *H02M 7/217* (2013.01)

(58) Field of Classification Search
CPC ............... H01L 41/113; H01L 41/1132; H01L 41/1134; H01L 41/1136; H01L 41/1138
USPC .......................................................... 310/339
See application file for complete search history.

(56) References Cited

U.S. PATENT DOCUMENTS

| | | |
|---|---|---|
| 7,781,943 B1 | 8/2010 | Hamel et al. |
| 8,082,041 B1 | 12/2011 | Radziemski |
| 8,253,307 B2 | 8/2012 | Wright |
| 8,513,861 B2 | 8/2013 | Horiguchi et al. |
| 8,777,863 B2 | 7/2014 | Piaget et al. |
| 8,974,366 B1 | 3/2015 | Radziemski et al. |
| 9,450,510 B2 | 9/2016 | Hsieh |
| 9,548,680 B2 | 1/2017 | Eltamaly et al. |
| 2016/0197552 A1* | 7/2016 | Giuliano ............... H02M 3/07 363/60 |
| 2017/0033577 A1* | 2/2017 | Ueno ................... H02J 7/0029 |

OTHER PUBLICATIONS

M. Monge, M. Raj, M. H. Nazari, H. C. Chang, Y. Zhao, J. D. Weiland, M.S Humayun, Y.C. Tai, and A. Emami, "A fully intraocular high-density self-calibrating epiretinal prosthesis," IEEE transactions on biomedical circuits and systems, vol. 7, No. 6, pp. 747-760, 2013.

(Continued)

*Primary Examiner* — Derek J Rosenau
(74) *Attorney, Agent, or Firm* — Eagle IP Limited; Jacqueline C. Lui

(57) ABSTRACT

A flipping-capacitor rectifier circuit that enhances an output power of a piezoelectric energy harvester (PEH). The flipping-capacitor rectifier circuit includes a flipping capacitor, a plurality of switches, and an active rectifier. The flipping capacitor is connected in parallel with the PEH and forms at least three reconfiguration phases by turning on one or more of the switches. The active rectifier connects with the flipping capacitor in parallel and rectifies an AC voltage of the PEH. The flipping capacitor flips a voltage across a capacitor of the PEH to enhance the output power of the PEH by extracting power from the capacitor of the PEH.

10 Claims, 16 Drawing Sheets

(56) References Cited

OTHER PUBLICATIONS

G. Chen, H. Ghaed, R. U. Haque, M. Wieckowski, Y. Kim, G. Kim, D. Fick, D. Kim, M. Seok, K. Wise, D.Blaauw, and D. Sylvester, "A cubic-millimeter energy-autonomous wireless intraocular pressure monitor," In Solid-State Circuits Conference Digest of Technical Papers (ISSCC), 2011 IEEE International, pp. 310-312, 2011.

M. Yip, R. Jin, H. H. Nakajima, K. M. Stankovic, and A. P. Chandrakasan, "A fully-implantable cochlear implant SoC with piezoelectric middle-ear sensor and arbitrary waveform neural stimulation," IEEE journal of solid-state circuits, vol. 50, No. 1, pp. 214-229, 2015.

M. M. Ahmadi, and G. A. Jullien, "A wireless-implantable microsystem for continuous blood glucose monitoring," IEEE Transactions on Biomedical Circuits and Systems, vol. 3, No. 3, pp. 169-180, 2009.

T. Maleki, N. Cao, S. H. Song, C. Kao, S. C. Ko, and B. Ziaie, "An ultrasonically powered implantable micro-oxygen generator (IMOG)," IEEE transactions on Biomedical Engineering, vol. 58, No. 11, pp. 3104-3111, 2011.

F. Mazzilli, P. E. Thoppay, V. Praplan, and C. Dehollain, "Ultrasound energy harvesting system for deep implanted-medical-devices (IMDs)," In Circuits and Systems (ISCAS), 2012 IEEE International Symposium on, pp. 2865-2868, 2012.

D. A. Sanchez, J. Leicht, F. Hagedorn, E. Jodka, E. Fazel, and Y. Manoli, "A Parallel-SSHI Rectifier for Piezoelectric Energy Harvesting of Periodic and Shock Excitations," IEEE Journal of Solid-State Circuits, vol. 51, No. 12, pp. 2867-2879, 2016.

S. Roundy, and P. K. Wright, "A piezoelectric vibration based generator for wireless electronics," Smart Materials and structures, vol. 13, No. 5, pp. 1131-1142, 2004.

T. T. Le, j. Han, A. von Jouanne, K. Mayaram, and T. S. Fiez, "Piezoelectric micro-power generation interface circuits," IEEE journal of solid-state circuits, vol. 41, No. 6, pp. 1411-1420, 2006.

Y. K. Ramadass, and A. P. Chandrakasan, "An efficient piezoelectric energy harvesting interface circuit using a bias-flip rectifier and shared inductor," IEEE Journal of Solid-State Circuits, vol. 45, No. 1, pp. 189-204, 2010.

Z. Chen, M. K. Law, P. I. Mak, W. H. Ki, and R. P. Martins, "A 1.7 mm 2 inductorless fully integrated flipping-capacitor rectifier (FCR) for piezoelectric energy harvesting with 483% power-extraction enhancement," In Solid-State Circuits Conference (ISSCC), 2017 IEEE International, pp. 372-373, 2017.

A. P. Chandrakasan, N. Verma, and D. C. Daly, "Ultralow-power electronics for biomedical applications," Annual review of biomedical engineering, pp. 247-274, 2008.

H. K. Cha, W. T. Park, and M. Je, "A CMOS rectifier with a cross-coupled latched comparator for wireless power transfer in biomedical applications," IEEE Transactions on Circuits and Systems II: Express Briefs, vol. 59, No. 7, pp. 409-413, 2012.

H. Shao, C. Y. Tsui, and W. H. Ki, "An inductor-less MPPT design for light energy harvesting systems," In Design Automation Conference, 2009. ASP-DAC 2009. Asia and South Pacific, pp. 101-102, 2009.

D. Kwon & G. A. Rincón-Mora, "A single-inductor 0.35 μm CMOS energy-investing piezoelectric harvester," IEEE Journal of Solid-State Circuits, vol. 49, No. 10, pp. 2277-2291, 2014.

L. Wu, X. D. Do, S. G. Lee, and D. S. Ha, "A self-powered and optimal SSHI circuit integrated with an active rectifier for piezoelectric energy harvesting," IEEE Transactions on Circuits and Systems I: Regular Papers, vol. 64, No. 3, pp. 537-549, 2017.

S. Du, Y. Jia, C. D. Do, & A. A. Seshia, "An efficient sshi interface with increased input range for piezoelectric energy harvesting under variable conditions," IEEE Journal of Solid-State Circuits, vol. 51, No. 11, pp. 2729-2742, 2016.

Y. S. Yuk, S. Jung, H. D. Gwon, S. Choi, S. D. Sung, T. H. Kong, S. W. Hong, J. H. Choi, M. Y. Jeong, J. P. Im, S. T. Ryu, & G. H. Cho, "An energy pile-up resonance circuit extracting maximum 422% energy from piezoelectric material in a dual-source energy-harvesting interface," In Solid-State Circuits Conference Digest of Technical Papers (ISSCC), 2014 IEEE International, pp. 402-403, 2014.

J. Charthad, M. J. Weber, T. C. Chang, and A. Arbabian, "A mm-sized implantable medical device (IMD) with ultrasonic power transfer and a hybrid bi-directional data link," IEEE Journal of Solid-State Circuits, vol. 50, No. 8, pp. 1741-1753, 2015.

\* cited by examiner

900

| Switch # | Control phase | | | | | | |
|---|---|---|---|---|---|---|---|
| | -3 | -2 | -1 | 0 | 1 | 2 | 3 |
| $S_0$ | Off | Off | Off | On | Off | Off | Off |
| $S_{11}$ | On | On | On | Off | Off | Off | Off |
| $S_{12}$ | Off | Off | Off | Off | On | On | On |
| $S_{13}$ | Off | Off | Off | Off | On | Off | Off |
| $S_{14}$ | Off | Off | On | Off | Off | Off | Off |
| $S_{21}$ | On | Off | On | Off | Off | Off | Off |
| $S_{22}$ | Off | Off | Off | Off | On | Off | On |
| $S_{23}$ | Off | Off | Off | Off | On | On | Off |
| $S_{24}$ | Off | On | On | Off | Off | Off | Off |
| $S_{31}$ | Off | On | On | Off | Off | Off | Off |
| $S_{32}$ | Off | Off | Off | Off | On | On | Off |
| $S_{33}$ | Off | Off | Off | Off | On | Off | Off |
| $S_{34}$ | Off | Off | On | Off | Off | Off | Off |
| $S_{41}$ | Off | Off | On | Off | Off | Off | Off |
| $S_{42}$ | Off | Off | Off | Off | On | Off | Off |
| $S_{43}$ | Off | Off | Off | Off | On | On | On |
| $S_{44}$ | On | On | On | Off | Off | Off | Off |
| $S_{i1}$ | On | Off | Off | Off | Off | Off | On |
| $S_{i2}$ | On | Off | Off | Off | Off | Off | On |
| $S_{i3}$ | On | On | Off | Off | Off | On | On |
| $S_{i4}$ | Off | On | Off | Off | Off | On | Off |

Figure 9

FLIPPING-CAPACITOR RECTIFIER CIRCUIT

FIELD OF THE INVENTION

The present invention relates to a method and system that includes a flipping-capacitor rectifier circuit that enhances an output power of a piezoelectric energy harvester.

BACKGROUND

Wireless sensing systems and biomedical implants usually have small sizes and require power to function. Highly efficient energy generation approaches are required to supply the system energy. Energy harvesting is an alternative approach compared to conventional battery-powered systems. In case of existing implantable systems, including retinal prosthesis, intraocular pressure monitoring, cochlear implants, subcutaneous glucose monitoring, micro-oxygenator and many others, they can benefit from scavenging energy from ambient sources to achieve minimal invasiveness and extend the system lifetime.

New methods and systems with high power transfer efficiency will assist in advancing technological needs and solving technological problems.

SUMMARY OF THE INVENTION

One example embodiment is a flipping-capacitor rectifier circuit that enhances an output power of a piezoelectric energy harvester (PEH). The flipping-capacitor rectifier circuit includes a flipping capacitor, a plurality of switches, and an active rectifier. The flipping capacitor is connected in parallel with the PEH and forms at least three reconfiguration phases by turning on one or more of the switches. The active rectifier connects with the flipping capacitor and rectifies an AC voltage of the PEH. The flipping capacitor flips a voltage across a capacitor of the PEH to enhance the output power of the PEH by extracting power from the capacitor of the PEH.

Other example embodiments are discussed herein.

BRIEF DESCRIPTION OF THE DRAWINGS

FIG. 9 shows a table of switch status at different control phases in accordance with an example embodiment.

DETAILED DESCRIPTION

Figure 1:
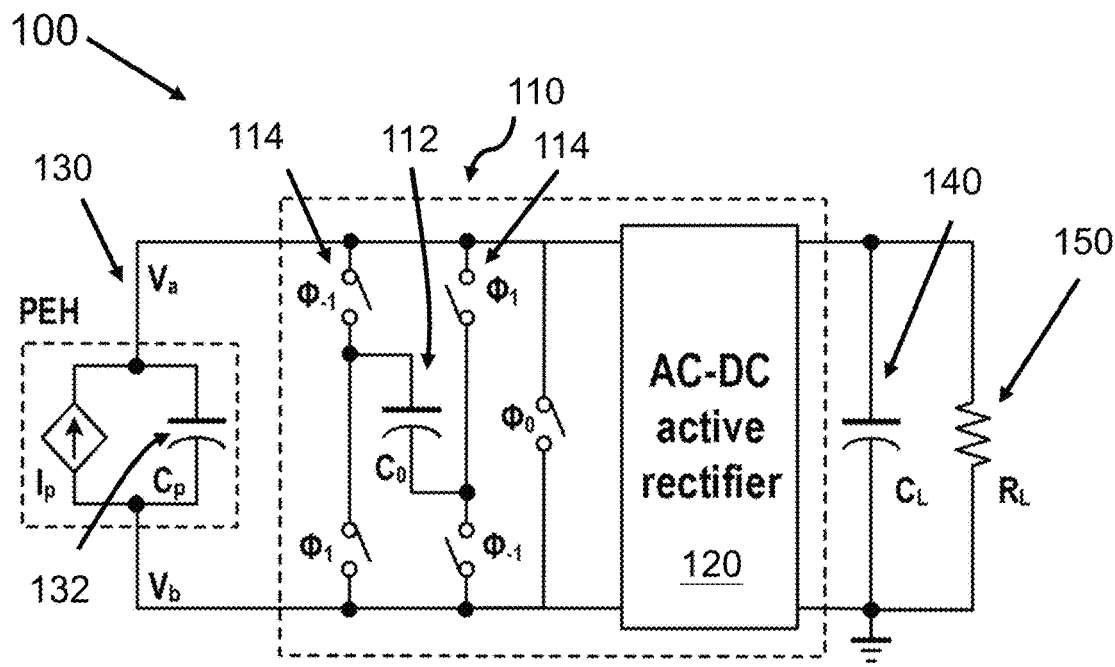
FIG. 1 shows a flipping-capacitor rectifier circuit with a flipping capacitor in accordance with an example embodiment.

Examples embodiments relate to a method and system that enhances an output power of a piezoelectric energy harvester via a flipping-capacitor rectifier circuit.

Energy harvesters can provide power for electronics. Energy harvesting is a process that derives energy from external sources. The derived energy is further captured, and stored in energy storage elements (e.g. batteries/capacitors). The stored energy is extracted to provide power for electronic devices, such as wireless autonomous devices used in wireless sensor networks and wearable/implantable electronics.

PEH is a popular choice for energy harvesting due to its high-power density, high scalability, and high output voltage generation. When the PEH is subjected to mechanical vibrations, stress is induced within the material, thus giving rise to an electromotive force that generates harvestable electrical charge. The PEH can be modeled as a spring-mass-damper system. The equivalent electromechanical model of a PEH can be reduced to a dependent current source $I_p$ in parallel with an inherent piezoelectric capacitor $C_p$. $I_p$ depends on the PEH mechanical properties, such as the effective mechanical mass, the inverse of the spring stiffness, and the mechanical loss.

By way of example, example conventional approaches to extract energy from the PEH are the full bridge rectifier (FBR), the switch only rectifier (SOR), and the parallel-synchronized-switch harvesting-on-inductor (P-SSHI). The FBR is implemented with discrete components to convert the PEH AC current into a DC output voltage. However, the charge loss ($Q_{loss}$) of the PEH parasitic capacitor $C_p$ due to voltage inversion limits the energy extraction capability. The SOR approach resolves this problem by shorting the PEH when the current $I_p$ of the PEH turns to zero (hereinafter zero crossing of $I_p$). As a result, the voltage change of the parasitic capacitor $C_p$ is reduced by half, effectively doubling the extracted power.

To extract more energy from the PEH, the P-SSHI approach swiftly flips the voltage across $C_p$ by LC resonance, effectively increasing the conduction period and enhancing the extractable energy. However, this approach requires a large inductor with a high quality factor (Q) to achieve a high rebuilt voltage to reduce $Q_{loss}$, requiring extra external components and increasing the system size and cost. Apart from that, it also imposes the restriction that the excitation frequency ($f_{EX}$) is much lower than the LC resonance frequency, i.e. the flip time ($t_{flip}$) required to reverse the PEH voltage during the zero crossing of $I_p$ is short. This can jeopardize the choice of inductors, especially in cases where the excitation frequency is high (e.g. can be up to MHz for ultrasound energy harvesting for biomedical implant applications).

Example embodiments solve these problems and provide significant improvements over the conventional approaches. As one example, an example embodiment eliminates the external high-Q inductors and integrating a flipping-capacitor rectifier (FCR) circuit with the piezoelectric energy harvester (PEH).

As another example, example embodiments include a fully-integrated piezoelectric energy harvesting interface without external components. Instead of relying on bulky external inductors with high quality factor as in the P-SSHI approach, a flipping-capacitor rectifier topology achieves voltage inversion for the PEH through a reconfigurable capacitor array. This enables the possibility of a fully-integrated solution without inductors while achieving a high energy extraction capability.

By way of example, measurement results show the flipping-capacitor rectifier enhances the output power of the PEH by up to 3.4 times, which is close to the theoretical prediction.

In another embodiment, a 7-phase flipping-capacitor rectifier circuit with 4 Metal-Insulator-Metal (MIM) capacitors and 21 switches that are fabricated by a 0.18-μm 1.8/3.3/6V complementary metal-oxide-semiconductor (CMOS) process, occupies an active area of ~1.7 mm² on the chip. An active rectifier is fabricated based on a common-gate comparator with phase alignment to ensure high speed operation while minimizing the diode voltage drop. A phase generate-and-combine circuit eliminates redundant switching activities. Systematic optimization of the three main energy loss mechanism, including phase offset, incomplete charge transfer and reduced conduction time, is also implemented. Measurement results show that the output power of the PEH is enhanced by up to 4.83 times at an excitation frequency of 110 kHz.

In one example embodiment, a flipping-capacitor rectifier circuit is connected with a PEH in parallel to extract power from the PEH efficiently and enhance an output power of the PEH. The flipping-capacitor rectifier circuit includes a flipping capacitor, a plurality of switches, and an active rectifier. The flipping capacitor is connected in parallel with the PEH and forms three reconfiguration phases by turning on one or more of the switches. The active rectifier connects with the flipping capacitor in parallel and rectifies an AC voltage of the PEH. The flipping capacitor flips a voltage across a capacitor of the PEH to enhance the output power of the PEH by extracting power from the capacitor of the PEH.

In another example embodiment, a flipping-capacitor rectifier circuit enhances an output power of a piezoelectric energy harvester (PEH) through a reconfigurable capacitor array. The reconfigurable capacitor array includes a plurality of flipping capacitors and switches. The flipping capacitors are connected with each other in parallel or in series to form different configurations by turning on one or more of the switches. Each of the configurations of the flipping capacitor array corresponds to a reconfiguration phase.

The flipping-capacitor rectifier circuit includes an active rectifier that connects with the reconfigurable capacitor array in parallel. The active rectifier rectifies an AC voltage of the PEH, and aligns the reconfiguration phases of the reconfigurable capacitor array. A switch driver connects with the reconfigurable capacitor array in series and controls the switches of the reconfigurable capacitor array. A phase generate-and-combine circuit connects with the switch driver and the active rectifier in series and sends control signals to the switch driver.

By way of example, the reconfiguration phases include a sharing phase, a shorting phase, and a recharging phase. In the sharing phase, charges that are stored in a capacitor of the PEH is redistributed to the flipping capacitors of the reconfigurable capacitor array. Specific switches are turned on to direct charges from the capacitor of the PEH to the flipping capacitor.

The shorting phase lasts for a period of time during which the capacitor of the PEH is completely discharged. Upon complete charge transfer between the capacitor of the PEH and the flipping capacitors, one of the five switches is turned on with the rest four switches turned off, to isolate the flipping capacitor from the flipping-capacitor rectifier to minimize a charge loss from the flipping capacitor.

In the recharging phase, charges discharged from the capacitor of the PEH flow back to the capacitor of the PEH from the flipping capacitors such that the capacitor of the PEH is recharged. Some of the switches are turned on to discharge the flipping capacitor by directing charges from the flipping capacitor to the capacitor of the PEH. In this phase, a voltage across the PEH is flipped compared with the voltage of the PEH in the sharing phase.

In an example embodiment, the flipping-capacitor rectifier circuit enhances the output power of the PEH by a maximum output power improving rate (MOPIR). The MOPIR is determined by the total number of the reconfiguration phases formed by the flipping capacitor array, as well as the capacitor ratio between the flipping capacitor and the capacitor of the PEH. The MOPIR is higher with a higher number of the reconfiguration phases and/or a higher capacitor ratio.

FIG. 1 shows a flipping-capacitor rectifier circuit or a PEH system 100 with a flipping capacitor in accordance with an example embodiment. The PEH system 100 includes a flipping-capacitor rectifier 110, including an active rectifier 120, a flipping capacitor 112 and five switches 114 that are connected with the flipping capacitor. The active rectifier 120 is further connected with a capacitor 140 in parallel and a resistor 150 in parallel as loading. The flipping-capacitor rectifier circuit 110 connects with a PEH 130 to flip a voltage across the PEH, and rectifies an AC voltage of the PEH 132 using an active rectifier 120. The flipping-capacitor rectifier circuit 110 enhances the output power of the PEH 132 by extracting power from the capacitor 132 of the PEH.

By way of example, the flipping capacitor 112 forms three reconfiguration phases by turning on one or more of the switches 114. The reconfiguration phases include a sharing phase, a shorting phase, and a recharging phase. In the sharing phase, two of the five switches of the flipping-capacitor rectifier circuit that are labeled as $\phi_{-1}$ in FIG. 1 are turned on to direct a charge flow. Charges that are stored in a capacitor 132 of the PEH flow out and are redistributed to the flipping capacitors 112.

The shorting phase lasts for a period of time in which the capacitor 132 of the PEH is completely discharged. When charges of the capacitor of the PEH is transferred to the flipping capacitor, one of the five switches of the flipping-capacitor rectifier circuit 110 that are labeled as $\phi_0$ in FIG. 1 is turned on, with the rest four switches turned off, to isolate the flipping capacitor 112 from the flipping-capacitor rectifier circuit to minimize a charge loss of the flipping capacitor 112.

In the recharging phase, charges out of the capacitor of the PEH during the sharing phase flow back from the flipping capacitor to the capacitor of the PEH such that the capacitor 132 of the PEH is recharged. In the recharging phase, two of the five switches of the flipping-capacitor rectifier 110 that are labeled as $\phi_1$ in FIG. 1 are turned on to direct a charge flow. Charges are directed from the flipping capacitor 112 to the capacitor 132 of the PEH. In this phase, the voltage across the capacitor 132 of the PEH is flipped compared with the voltage of the PEH in the sharing phase.

In an example embodiment, the PEH system 100 enhances the output power of the PEH by a maximum output power improving rate (MOPIR). The MOPIR is determined by the total number of the reconfiguration phases formed by the flipping-capacitor rectifier circuit, as well as the capacitor ratio between the flipping capacitor and the capacitor of the PEH and the flipping capacitor. The value of MOPIR is dependent on the number of the reconfiguration phases formed by the flipping-capacitor rectifier and the capacitor ratio. MOPIR is higher with a higher number of the reconfiguration phases and/or a higher capacitor ratio.

Figure 2:
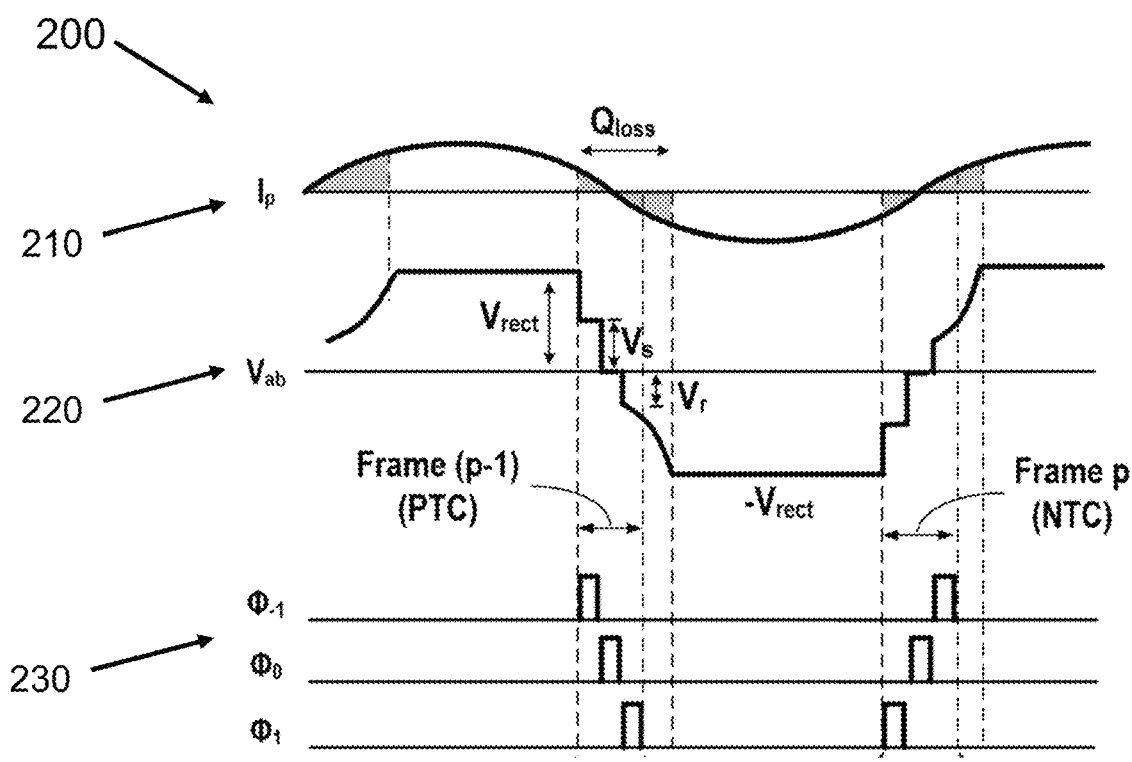
FIG. 2 shows a graph of current waveform, a voltage waveform and a control phase waveform in accordance with an example embodiment.

FIG. 2 shows a graph 200 of a current waveform 210, a voltage waveform 220 and a control phase waveform 230 in accordance with an example embodiment.

As one example, the current waveform 210, the voltage waveform 220 and the control phase waveform 230 correspond to the flipping-capacitor rectifier circuit as shown in FIG. 1. As shown in FIG. 1, the flipping-capacitor rectifier circuit 110 with one flipping capacitor 112, five switches 114 and an active rectifier 120 is represented by $FCR_1$. $FCR_1$ forms three reconfiguration phases by turning on one or more of the switches.

FIG. 2 shows the corresponding voltage, current and phase control waveforms for both the positive transition cycle (PTC) and the negative transition cycle (NTC). Due to symmetrical operations, $FCR_1$ during the NTC is further discussed as example, i.e. frame p from $t_p$ to $t_p+t_{flip}$ in FIG. 2. Based on the direction of charge flow, the operations of the flipping-capacitor rectifier circuit can be sub-divided into three phases: the sharing phase ($\phi_{-1}$) when the charge in $C_p$ is redistributed to $C_0$, the shorting phase ($\phi_0$) when $C_p$ is completely discharged, and the recharging phase ($\phi_1$) when $C_p$ is recharged in an opposite direction through $C_0$.

By way of example, $FCR_1$ enhances an output power of PEH by a maximum output power improving rate (MOPIR). In the steady state, the rectifier output voltage is equal to $V_{rect}$, as labeled in FIG. 1. The PEH voltages ($V_{ab}$) at the end of the current sharing and recharging phases (i.e. frame p) are defined as $V_s$ and $V_r$, respectively. Based on charge conservation, the charge balancing equations for $\phi_{-1}$ and $\phi_1$ are expressed as:

$$V_s(C_p+C_0)=C_p V_{rect}+C_0 V'_r, \quad (1)$$

$$V_r(C_p+C_0)=C_0 V_s, \quad (2)$$

where $V'_r$ is the rebuilt voltage at the end of the previous recharging phase (i.e. frame (p−1)). As $V_r=V'_r$ during the steady state, $k_{FCR1}$ is represented by:

$$k_{FCR1} = \frac{V_r}{V_{rect}} = \frac{1}{2+\frac{C_p}{C_0}}, \quad (3)$$

where $k_{FCR1}$ denotes a ratio between the PEH rebuilt voltage and the rectifier voltage within one FCR operation cycle, which is a direct indication of the power extraction efficiency. To estimate the maximum output power achievable by $FCR_1$, with a total charge $Q_{out}$ transferred to the output of the flipping-capacitor rectifier circuit, the output power delivered by the PEH operating at an excitation frequency $f_{EX}$ is computed as:

$$P_{out}=Q_{out}V_{rect} \times 2f_{EX}. \quad (4)$$

During half of a switching cycle, the charge transferred to the output is the difference between the charge generated by the PEH and the loss in charge, represented by:

$$Q_{out}=2C_p V_p - Q_{loss}, \quad (5)$$

where $V_p$ is the PEH open-circuit voltage. The charge loss $Q_{loss}$ is due to the recharging of $C_p$ from $V_r$ to $V_{rect}$, and is represented by:

$$Q_{loss}=C_p(V_{rect}-V_r). \quad (6)$$

Combining (3) to (6) leads to:

$$P_{out}=2C_p V_{rect} f_{EX}(2V_p-(1-k_{FCR1})V_{rect}). \quad (7)$$

By differentiating (7) with respect to $V_{rect}$ and equating the result to zero, the $FCR_1$ output power is at maximum when $V_{rect}=V_p/(1-k_{FCR1})$, and $$P_{FCR1,max} = \frac{2C_p V_p^2 f_{EX}}{1-k_{FCR1}}. \quad (8)$$

The above equation indicates that the $FCR_1$ maximum output power is dependent on $k_{FCR1}$ (as $C_p$, $V_p$ and $f_{EX}$ are fixed for a particular PEH under a predetermined excitation frequency). The maximum output power for FBR and SOR are $C_p V_p^2 f_{EX}$ and $2C_p V_p^2 f_{EX}$, respectively. The performance of $FCR_1$ can be quantitatively compared with FBR by the maximum output power improving rate (MOPIR) that is calculated by:

$$MOPIR_{FCR1} = \frac{P_{FCR1,max}}{P_{FBR,max}} = \frac{2}{1-k_{FCR1}}. \qquad (9)$$

From equation (9), $C_0=0$ for SOR, which leads to $k_{FCR1}=0$ and an MOPIR of 2. For $FCR_1$, based on equation (3), $k_{FCR1}$ converges to ½ as $C_0 \to \infty$, and equation (9) exhibits an asymptotic limit of 4. Therefore, the performance is improved by two times compared with SOR. The limited MOPIR with large $C_0$ in $FCR_1$ can be fundamentally improved by increasing the number of flipping capacitors from 1 to n.

Figure 3:
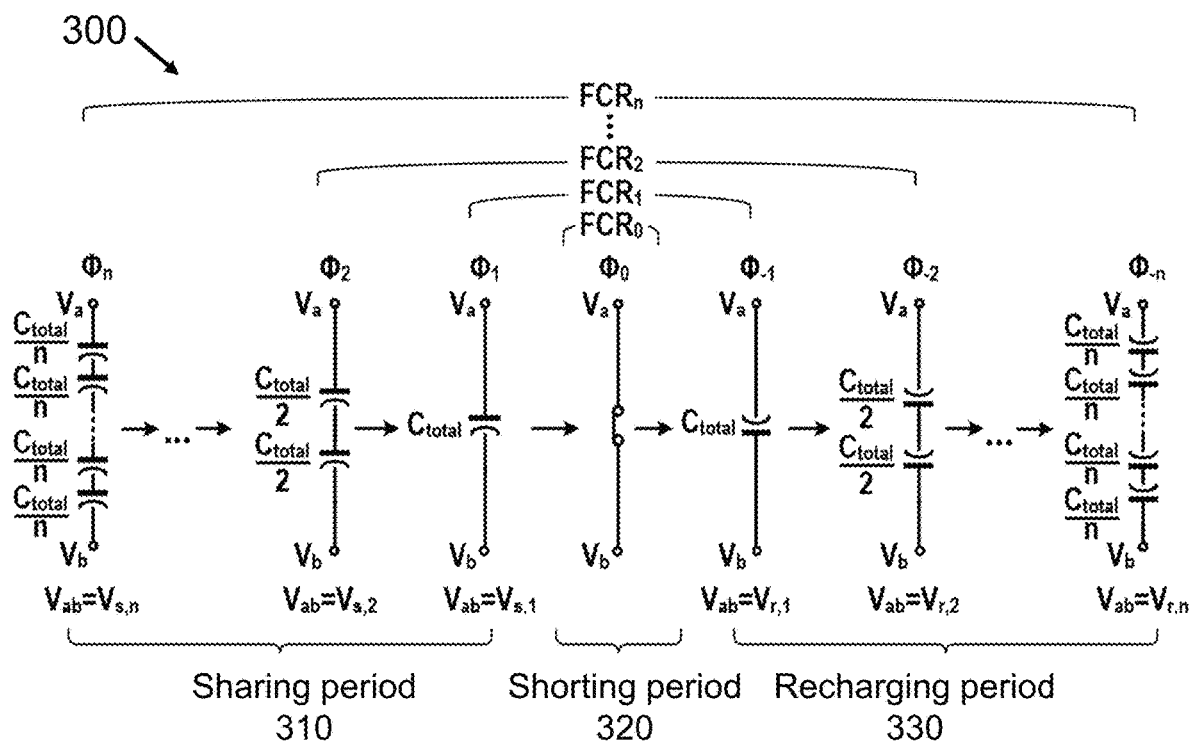
FIG. 3 shows a diagram 300 of capacitor configurations in accordance with an example embodiment.

FIG. 3 shows capacitor configurations in accordance with an example embodiment.

Consider an example in which a flipping-capacitor rectifier circuit is connected with a PEH to enhance the output power of the PEH. A higher MOPIR can be achieved by increasing the PEH voltage through reconfiguring an increased number of flipping capacitors in the flipping-capacitor rectifier circuit. By increasing the number of flipping capacitors in the flipping-capacitor rectifier circuit from 1 to n, $FCR_1$ is extended to $FCR_n$ by using n reconfigurable capacitors with a plurality of sharing/recharging phases. Due to symmetrical operations, the total number of reconfiguration phases for $FCR_n$ is 2n+1, where n is the number of switching phases in each of the sharing/recharging phases.

SOR is equivalent to $FCR_0$. The total capacitance ($C_{total}$) remains constant throughout the reconfiguration cycles. A total number of m capacitors each with a capacitance of $C_{total}/m$ are connected in series in the m-th sharing/recharging phase (m≤n). This ensures step-wise reconfiguration with balanced capacitance distribution to reduce charge redistribution loss. The switching phases for $FCR_n$ are denoted as $\phi_{-n}, \phi_{-(n-1)}, \ldots, \phi_{-1}, \phi_0, \phi_1, \ldots, \phi_{(n-1)}, \phi_n$. The PEH voltage ($V_{ab}$) is defined as $V_{s,m}$ and $V_{r,m}$ at the end of the current m-th sharing ($\phi_{-m}$) and recharging phase ($\phi_m$), respectively. The power extraction efficiency of $FCR_n$ is evaluated based on charge conservation. During the current sharing phase, the charge balancing equations for $\phi_{-n}$ and the general case $\phi_{-m}$ are represented by:

$$V_{s,n}\left(C_p + \frac{1}{n^2}C_{total}\right) = C_p V_{rect} + \frac{C_{total}}{n^2}V_{r,n}', \qquad (10)$$

$$V_{s,m}\left(C_p + \frac{1}{m^2}C_{total}\right) = C_p V_{s,m+1} + \frac{C_{total}}{m(m+1)}V_{s,m+1}, \qquad (11)$$

where m=1, 2, ..., n−1, and $V_{r,n}'$ is the rebuilt voltage at the end of the previous recharging phase. Note that the term $C_{total}/m^2$ of equation (11) is the equivalent capacitance of the flipping capacitor in the m-th sharing phase, while the coefficient m(m+1) is due to the reconfiguration of the flipping capacitor from (m+1) to m capacitors connected in series. Similarly, during the current recharging phase, the charge conservation equations for $\phi_n$ and the general case $\phi_m$ are:

$$V_{r,n}\left(C_p + \frac{1}{n^2}C_{total}\right) = C_{total}V_{r,1}, \qquad (12)$$

$$V_{r,m+1}\left(C_p + \frac{1}{m^2}C_{total}\right) = C_p V_{r,m} + \frac{C_{total}}{m(m+1)}V_{r,m}. \qquad (13)$$

During the steady state, $V_{r,n}'=V_{r,n}$, therefore $k_{FCRn}$ is calculated as:

$$k_{FCRn} = \frac{V_r}{V_{rect}} = \left[\frac{(1+x)^2}{x}\prod_{m=1}^{\frac{N-3}{2}}\frac{\left(1+\frac{x}{(m+1)^2}\right)^2}{\left(1+\frac{x}{(m+1)m}\right)^2} - \frac{4x}{(N-1)^2}\right]^{-1}, \qquad (14)$$

where $x=C_{total}/C_p$ is the ratio of the total flipping capacitor size to the PEH parasitic capacitor, and N=2n+1 is the number of phases (n=0 is the special case for SOR). From equation (14), it is noted that a larger $k_{FCRn}$ (and hence a higher power extraction improvement) can be achieved by increasing $C_{total}$ and N. By substituting equation (14) into equation (8), the MOPIR of an arbitrary FCR implementation can be determined. The voltage flipping efficiency ($\eta_F$) defined in equation (7) is closely related to $k_{FCRn}$. With a negligible rectifier diode drop, it is defined as:

$$\eta_F = \frac{V_r + V_{rect}}{2V_{rect}}. \qquad (15)$$

Figure 4:
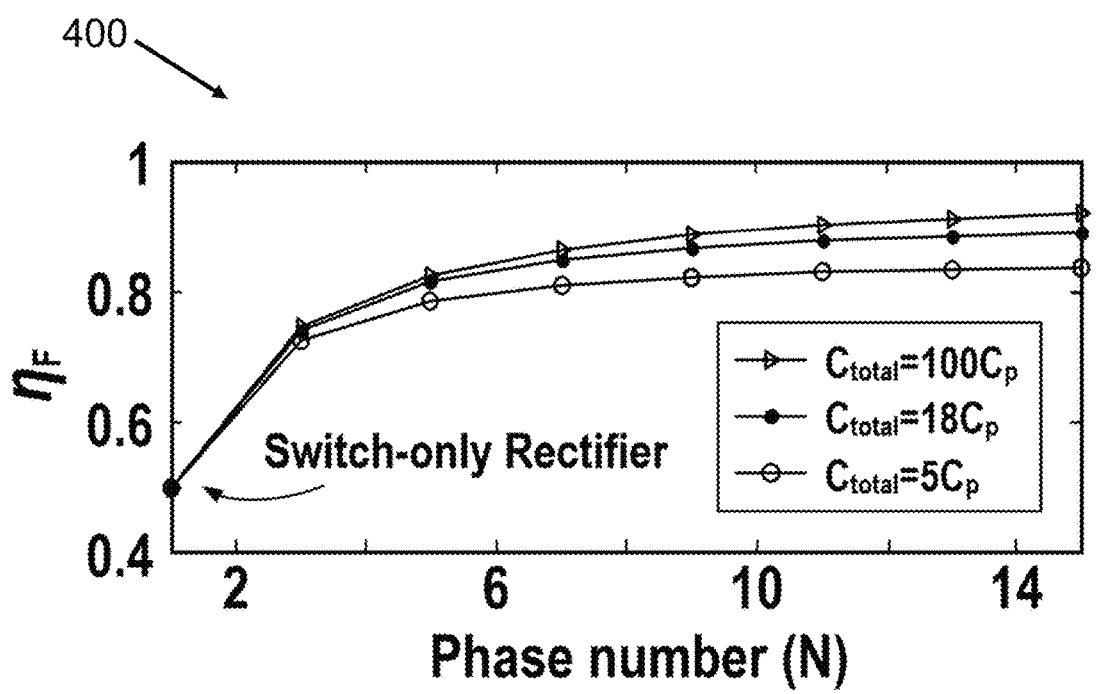
FIG. 4 shows a graph of calculated voltage flipping efficiency in accordance with an example embodiment.

FIG. 4 shows a graph 400 of calculated voltage flipping efficiency $\eta_F$ in accordance with an example embodiment. The X-axis shows phase number N, and the Y-axis shows values of the voltage flipping efficiency $\eta_F$, defined in equation (15), with respect to different phase numbers. Three curves with $C_{total}/C_p=5$, 18 and 100 are plotted as examples. As shown in FIG. 4, the achieved $\eta_F$ improves as N and $C_{total}/C_p$ increases.

Figure 5:
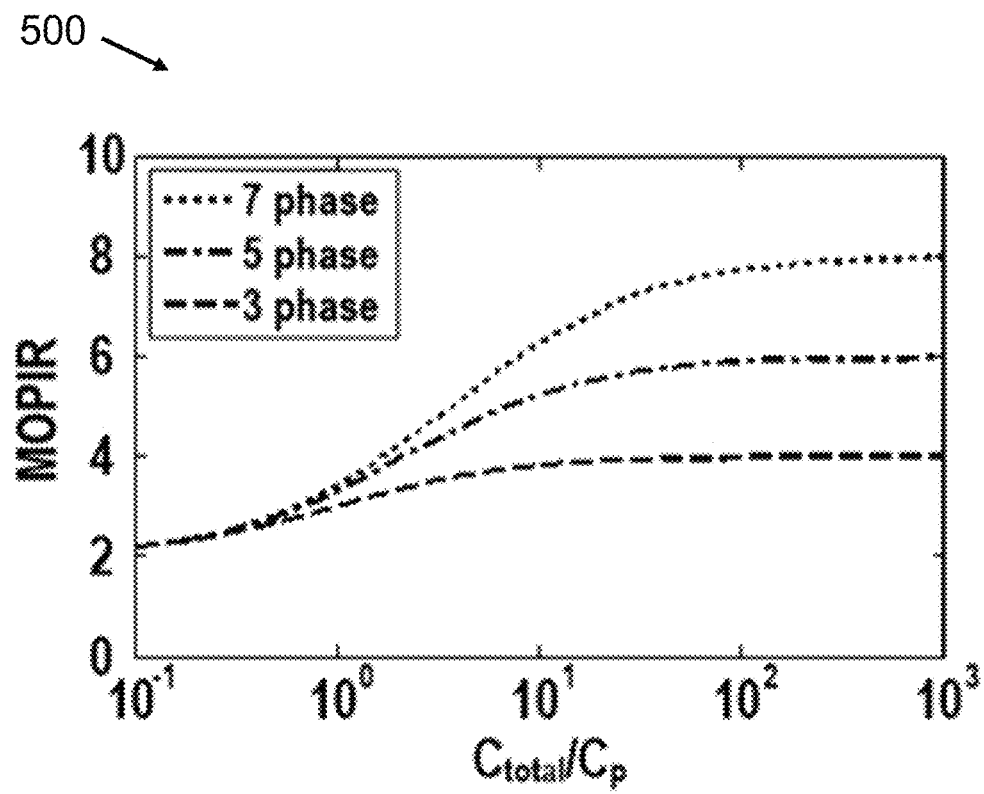
FIG. 5 shows a graph of calculated maximum output power improving rate (MOPIR) in accordance with an example embodiment.

FIG. 5 shows a graph 500 of calculated maximum output power improving rate (MOPIR) in accordance with an example embodiment. The X-axis shows $C_{total}/C_p$, and the Y-axis shows values of the MOPIR.

By way of example, FIG. 5 summarizes the theoretical MOPIR with respect to different $C_{total}/C_p$ ratios when phase number N=3, 5 and 7. Referring to equation (9) and (14), the maximum achievable MOPIR by $FCR_1$, $FCR_2$, $FCR_3$ are 4, 6 and 8, respectively. Moreover, the output power can be improved by increasing $C_{total}$ and N for a particular PEH, but the improvement flattens off as $C_{total}$ becomes much larger than $C_p$. A large $C_{total}$ means an increase in chip area, which is undesirable for the applications in compact devices. As an example, as N increases, the associated increase in the circuit complexity leads to a higher switching loss that limits the achievable MOPIR. Besides, the achievable system efficiency improvement of $FCR_n$ can also be degraded due to parasitic effects, which results in a reduced $k_{FCRn}$ as calculated in equation (14).

Figure 6:
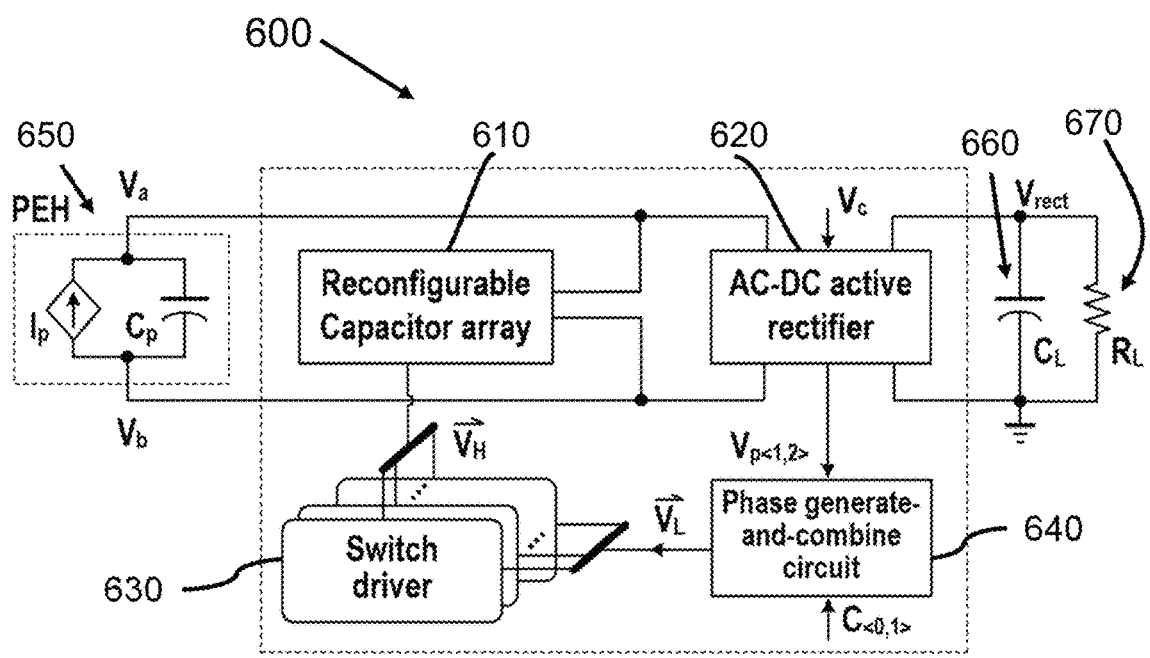
FIG. 6 shows a block diagram of a PEH system using a flipping-capacitor rectifier circuit in accordance with an example embodiment.

FIG. 6 shows a block diagram of a PEH system 600 using a flipping-capacitor rectifier circuit in accordance with an example embodiment.

The PEH system 600 with a flipping-capacitor rectifier circuit includes a reconfigurable capacitor array 610, an active rectifier 620, a switch driver 630 and a phase generate-and-combine circuit 640. The reconfigurable capacitor array 610 is connected with a PEH 650 in parallel. The active rectifier 620 is connected with the reconfigurable capacitor array 610 in parallel and is further connected with a capacitor 660 in parallel and a resistor 670 in parallel as loading.

The PEH system 600 extracts power from the PEH and enhances the output power of the PEH by flipping a voltage across the PEH during the zero crossing of $I_p$. The reconfigurable capacitor array 610 includes a plurality of flipping capacitors and switches that are connected with the flipping capacitor. The flipping capacitors are connected with each other in parallel or in series to form different configurations by turning on one or more of the switches. Each of the configurations of the flipping capacitor array corresponds to a reconfiguration phase.

The active rectifier 620 rectifies the voltage of the PEH 650 and aligns reconfiguration phases of the reconfigurable capacitor array 610. The switch driver 630 connects with the reconfigurable capacitor array 610 in series and turns on or turns off one or more of the switches of the reconfigurable capacitor array based on a control signal. The phase generate-and-combine circuit 640 connects with the switch driver 630 and the active rectifier 620 in series and sends the control signal to the switch driver.

By way of example, the reconfigurable capacitor array 610 forms a plurality of reconfiguration phases by turning on one or more of the switches of the reconfigurable capacitor array. The reconfiguration phases include a sharing phase when charges in a capacitor of the PEH is redistributed to the flipping capacitors of the reconfigurable capacitor array, a shorting phase when the capacitor of the PEH is completely discharged, and a recharging phase when the capacitor of the PEH is recharged through the flipping capacitors.

In an example embodiment, the PEH system 600 enhances the output power of the PEH 650 by a maximum output power improving rate (MOPIR). The MOPIR is determined by the total number of the reconfiguration phases formed by the reconfigurable capacitor array 610. The MOPIR is higher with a higher number of the reconfiguration phases and/or higher capacitor ratio.

In one example embodiment, the reconfigurable capacitor array 610 is composed of 4 flipping MIM capacitors that can form seven configurations. The active rectifier 620 rectifies the AC voltage of the PEH 650 while ensuring phase alignment. The phase generate-and-combine circuit 640 produces the required control signals that are level shifted by the switch driver 640 to ensure proper switching operations, and redundant switching activities are eliminated by phase combining to improve the system efficiency. As one example and with reference to FIG. 5, $C_{total}/C_p$ and N are set to 18 and 7, which balance the energy extraction efficiency, the area overhead and the design complexity, while achieving a theoretical $\eta_F$ of 0.85 as shown in FIG. 4 and MOPIR of 6.85 as shown in FIG. 5.

Figure 7:
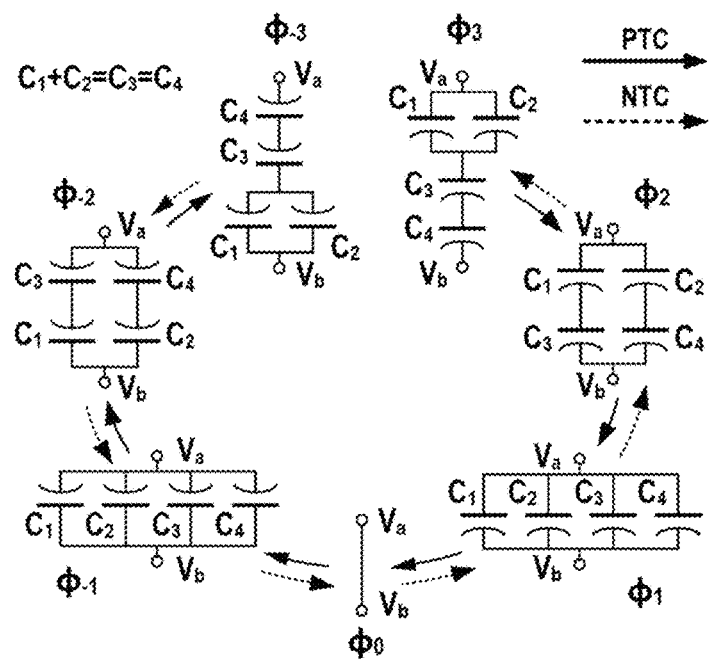
FIG. 7 shows configurations of a reconfigurable capacitor array in accordance with an example embodiment.

FIG. 7 shows configurations 700 of a reconfigurable capacitor array in accordance with an example embodiment.

Consider an example in which a flipping-capacitor rectifier (FCR) circuit is connected with a PEH as shown in FIG. 6. The flipping-capacitor rectifier circuit includes a configurable capacitor array composed of 4 flipping MIM capacitors that can form 7 configurations, as well as an active rectifier. Each of the configurations corresponds to a reconfiguration phase. The number of series-connected flipping capacitors in each phase are denoted as (3, 2, 1, 0, −1, −2, −3) during the PTC and (−3, −2, −1, 0, 1, 2, 3) during the NTC, respectively. The positive and negative signs indicate the polarity of the flipping capacitors with respect to $C_p$ of the PEH. To ensure balanced branch capacitance during the step-wise reconfiguration cycles, the configurable capacitor array includes 4 capacitors $C_1$, $C_2$, $C_3$, and $C_4$, with a relation of $2C_1=2C_2=C_3=C_4$.

On-chip MIM capacitors have parasitic top-plate capacitances and bottom-plate capacitances that are a few percent of the main capacitor. Parasitic capacitances incur extra energy loss that leads to reduced system efficiency. As the PEH generally exhibits negligible parasitic with reference to the substrate, this parasitic loss is mainly caused by stacking of capacitors, but is insignificant for the flipping operations (i.e. $\phi_{\pm 1}$).

Figure 8:
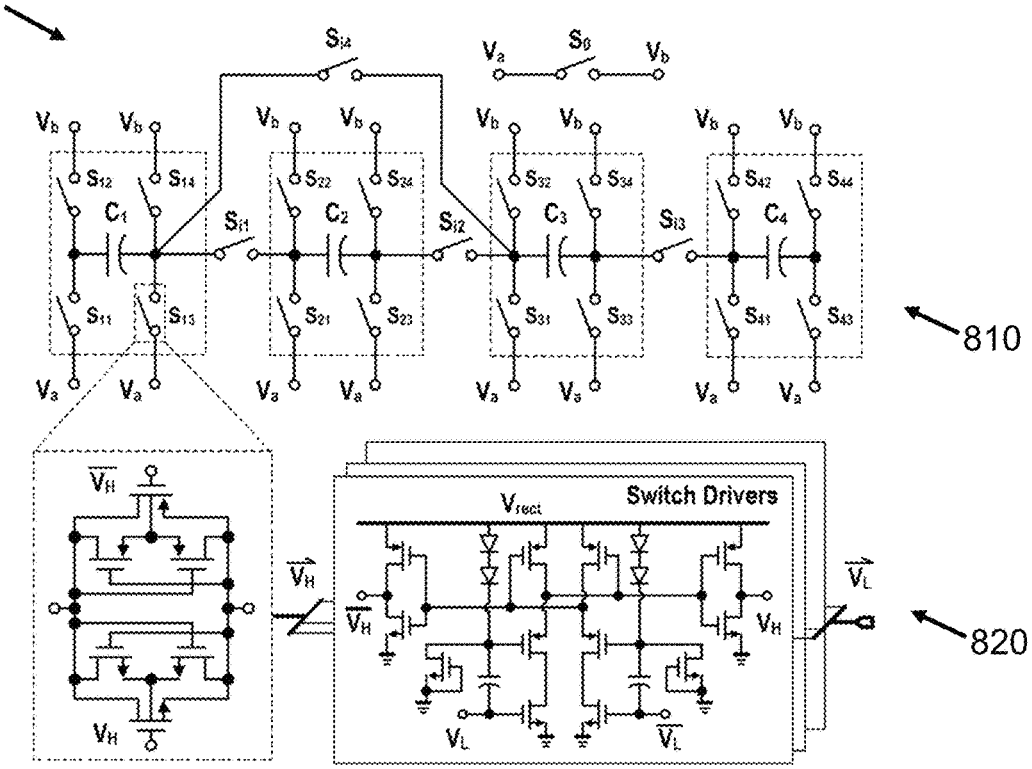
FIG. 8 shows a graph of a reconfigurable capacitor array connected with a switch driver in accordance with an example embodiment.

FIG. 8 shows a graph 800 of a reconfigurable capacitor array 810 connected with a switch driver 820 in accordance with an example embodiment.

By way of example, the reconfigurable capacitor array 810 is connected with a switch driver 820 in series. The reconfigurable capacitor array includes 4 flipping MIM capacitors that can form 7 configurations. The 7-phase capacitor configuration is realized by using a total of 21 switches, with $S_{i1-4}$ for interconnecting $C_{1-4}$ and $S_0$ for shorting $C_p$, as shown in FIG. 8.

The switches are implemented using transmission gates to reduce the conduction loss during different voltage level transitions in different phases. Active body biasing can be added to further enhance the switch conductance and to fulfill the stringent settling time requirement (<150 ns with $f_{EX}$=110 kHz) without increasing the reversion loss. The switch drivers are a group of level converters that translates $\vec{V_L}$ to $\vec{V_H}$. Two complementary bootstrapping capacitors of 50 fF each are implemented to turn on and turn off specific PMOS transistors from $V_{rect}-2V_d$ to $V_{rect}-2V_d+V_L$, where $V_d$ is the diode drop across the diodes in FIG. 8. Capacitor flipping operation occurs when the current $I_p$ of the PEH turns to zero and hence the operating frequency is $2f_{EX}$.

FIG. 9 shows a table 900 of switch status at different control phases in accordance with an example embodiment.

By way of example, table 900 tabulates the complete control sequence for each individual switch at difference control phases (−3, −2, −1, 0, 1, 2, 3) during the NTC. Some of the switches share the same controls, and are kept on in multiple phases. Such redundant switching activities are reduced through a phase generate-and-combine circuit that combines phases to reduce switching loss.

Figure 10:
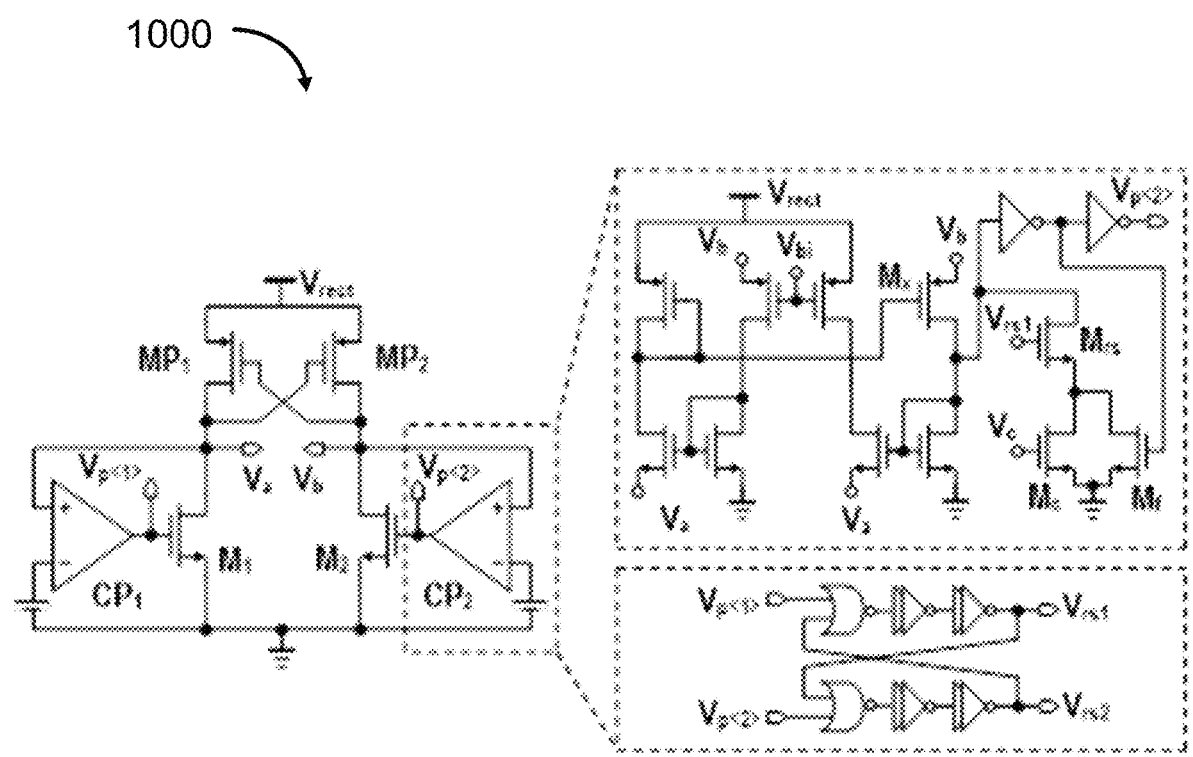
FIG. 10 shows an active rectifier in accordance with an example embodiment.

FIG. 10 shows an active rectifier 1000 in accordance with an example embodiment.

By way of example, the active rectifier 1000 conducts an AC to DC conversion that eliminates the diode voltage drop. With reference to FIG. 6, the equivalent diode drop is lower than 20 mV, which is less than 1% of the nominal $V_{rect}$. A phase alignment control circuit composed of $M_C$, $M_f$ and a SR-latch is embedded to reduce the loss due to the misalignment between the zero crossing of $I_p$ and the PEH shorting phase $\phi_0$. High speed operation is guaranteed by using a common-gate comparator. $M_C$ is controlled by $V_C$ externally to adjust the current that flows through $M_x$ (and hence the comparator offset, $V_{offset}$), which achieves comparator delay tuning of roughly 8.5 ns/mV for phase alignment. $M_f$ belongs to a positive feedback loop that guarantees fast comparator transitions. The SR latch that is controlled by $V_{p<1,2>}$ enforces operation only during $t_{flip}$.

Figure 11A:
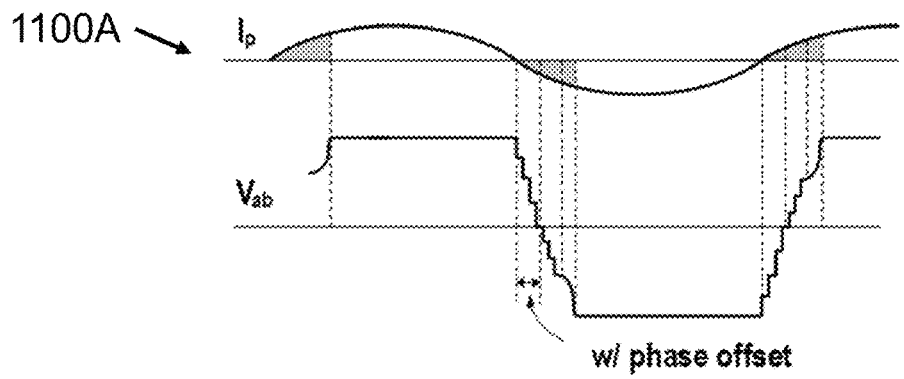
FIG. 11A shows an operation diagram 1100A of a flipping-capacitor rectifier circuit with phase offset in accordance with an example embodiment.
Figure 11B:
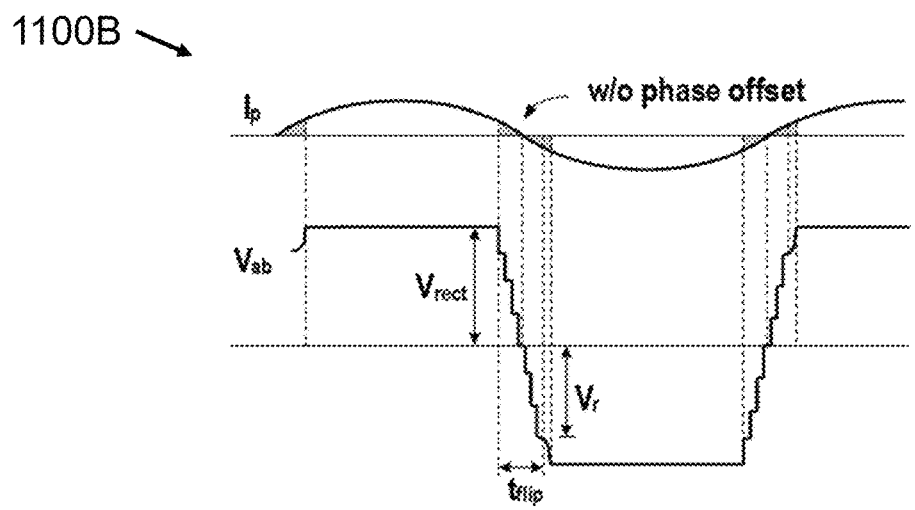
FIG. 11B shows an operation diagram 1100B of a flipping-capacitor rectifier circuit without phase offset in accordance with an example embodiment.

FIG. 11A shows an operation diagram of a flipping-capacitor rectifier circuit with phase offset in accordance with an example embodiment FIG. 11B shows an operation diagram of a flipping-capacitor rectifier circuit without phase offset in accordance with an example embodiment.

As shown in FIGS. 11A and 11B, with reference to FIG. 10, intrinsic comparator offset is added to the active rectifier 1000 to ensure that the FCR operation starts earlier than the transitions of $I_p$ for aligning $\phi_0$ when $I_p$=0. Closed-loop $V_C$ control can be accomplished by utilizing a maximum power point tracking circuit based on a perturb and observe method, where the optimal $V_C$ can be obtained by comparing two sampled output voltages at two different time instances.

Figure 12:
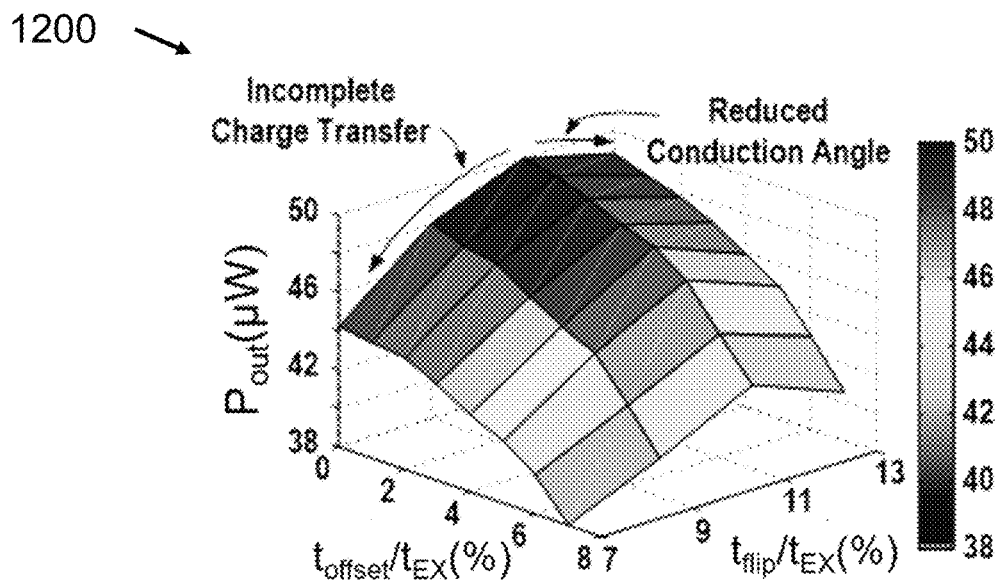
FIG. 12 shows simulated output power in accordance with an example embodiment.

FIG. 12 shows a graph 1200 of a simulated output power in accordance with an example embodiment.

As previously referenced, the energy loss optimization during $t_{flip}$ is required to improve the overall energy extraction efficiency, especially with a high $f_{EX}$. There are three main energy loss mechanisms during $t_{flip}$: loss due to the phase offset (t 1 that is defined as the time misalignment between the $I_p$ zero crossing and the PEH shorting phase, loss due to incomplete charge transfer because of insufficient settling time; and loss due to reduced conduction time as a result of excessive time allocated for RC settling. FIG. 12 summarizes the simulation results of the above three main energy loss mechanisms at $f_{EX}$=110 kHz. As one example, $t_{flip}$ is set as 10% of the excitation period ($t_{EX}$), corresponding to ~1 µs.

Figure 13:
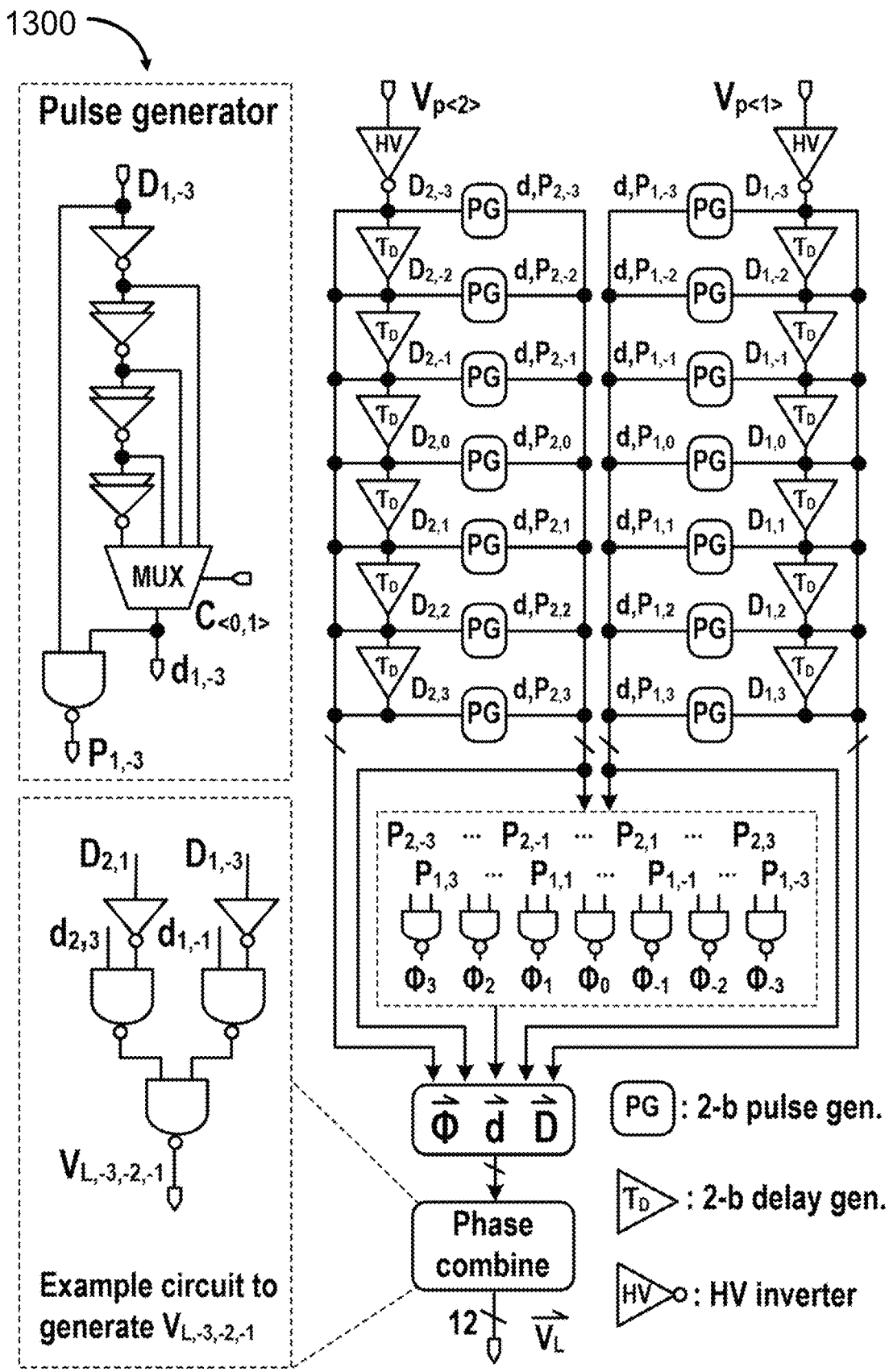
FIG. 13 shows a phase generate-and-combine circuit in accordance with an example embodiment.

FIG. 13 shows a phase generate-and-combine circuit 1300 in accordance with an example embodiment.

Figure 14:
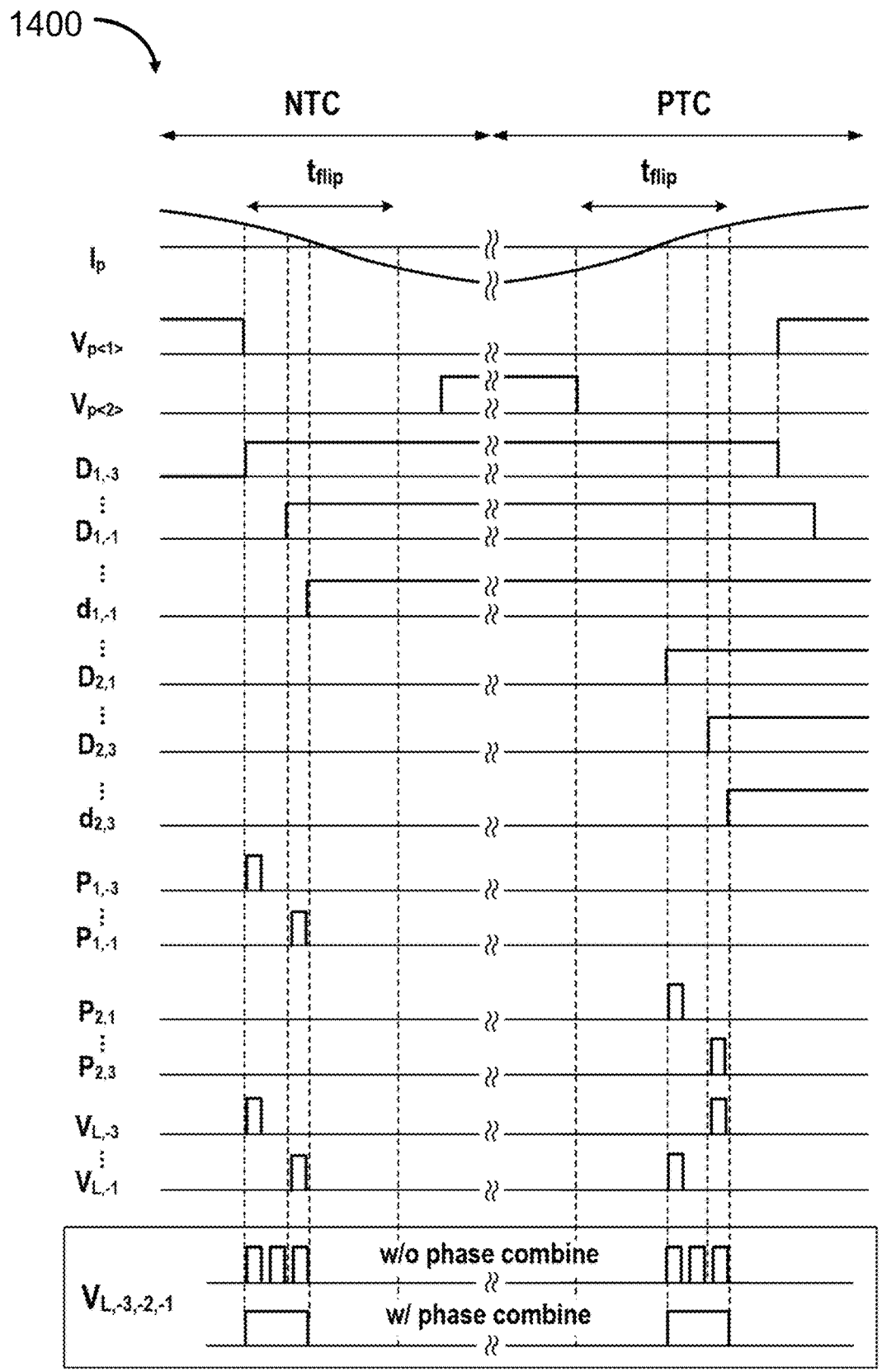
FIG. 14 shows a timing diagram of a phase generate-and-combine circuit in accordance with an example embodiment.

FIG. 14 shows a timing diagram 1400 of the phase generate-and-combine circuit 1300 in accordance with an example embodiment.

With reference to FIG. 6, consider an example in which a flipping-capacitor rectifier circuit includes a reconfigurable capacitor array, an active rectifier, a switch driver and a phase generate-and-combine circuit. The active rectifier rectifies the voltage of the PEH and aligns reconfiguration phases of the reconfigurable capacitor array. The switch driver turns on or turns off one or more of the switches of the reconfigurable capacitor array based on a control signal. The phase generate-and-combine circuit sends the control signal to the switch driver.

By way of example, the phase generate-and-combine circuit 1300 issues the control vector to the switch driver, with the corresponding timing diagram as shown in FIG. 14. The required phases are a group of non-overlapping successive pulses, with the beginning of $t_{flip}$ indicated by $V_{p<1,2>}$ transitions. Referring to FIG. 13, $C_{<0,1>}$ controls the 2-bit pulse generator (PG) as well as the 2-bit delay generator ($\tau_d$) to manipulate the pulse width and delay of the control vector to ensure complete charge transfer with non-overlapping pulse generation while minimizing $t_{flip}$. Furthermore, the positive and negative transitions of $I_p$, indicated by $V_{p<1>}$ and $V_{p<2>}$, are processed separately. $V_{p<1>}$ ($V_{p<2>}$) is delayed using 6 $\tau_d$ blocks to generate $D_{1,-3}$ to $D_{1,3}$ ($D_{2,-3}$ to $D_{2,3}$), which are connected to 7 PG blocks to determine a series of pulses $P_{1,-3}$ to $P_{1,3}$ ($P_{2,-3}$ to $P_{2,3}$).

As shown in FIG. 14, the 14 control signals are systematically processed to obtain the control vector $\phi_{<-3:3>}$, and are phase combined to obtain $V_{L<0:11>}$. As discussed in FIG. 9, redundant switching activities exist during the 7-phase reconfiguration cycles. As an example, $S_{11}$ in FIG. 8 should be turned on during $\phi_{-3}$, $\phi_{-2}$ and $\phi_{-1}$, as FIG. 9 shows. Multi-phase pulses are generated by combining multiple controls using the phase generate-and-combine circuit 1300, to reduce redundant switching activities through simple digital logics, as shown in FIG. 13. The pulses for $\phi_{-3}$, $\phi_{-2}$ and $\phi_{-1}$ are combined to $V_{L-3,-2,-1}$ in FIG. 14. The phase generate-and-combine circuit 1300 reduces the total number of pulses from 41 to 24, corresponding to a gate driving activity reduction of 41.5%.

Figure 15A:
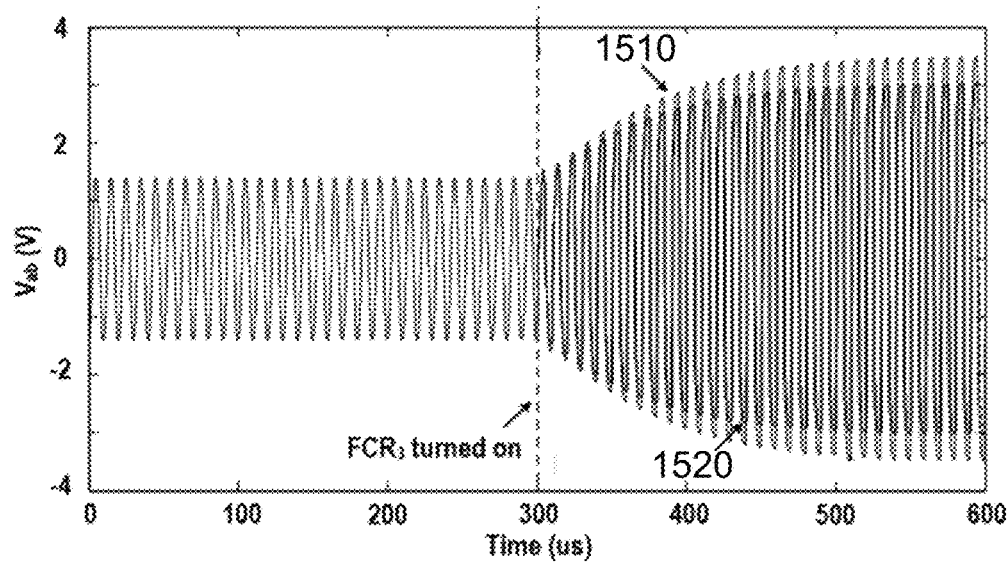
FIG. 15A shows a graph of simulated PEH voltage with and without phase alignment during startup and steady state in accordance with an example embodiment.

FIG. 15A shows a graph 1500A of simulated PEH voltage with and without phase alignment during startup and steady state in accordance with an example embodiment.

Figure 15B:
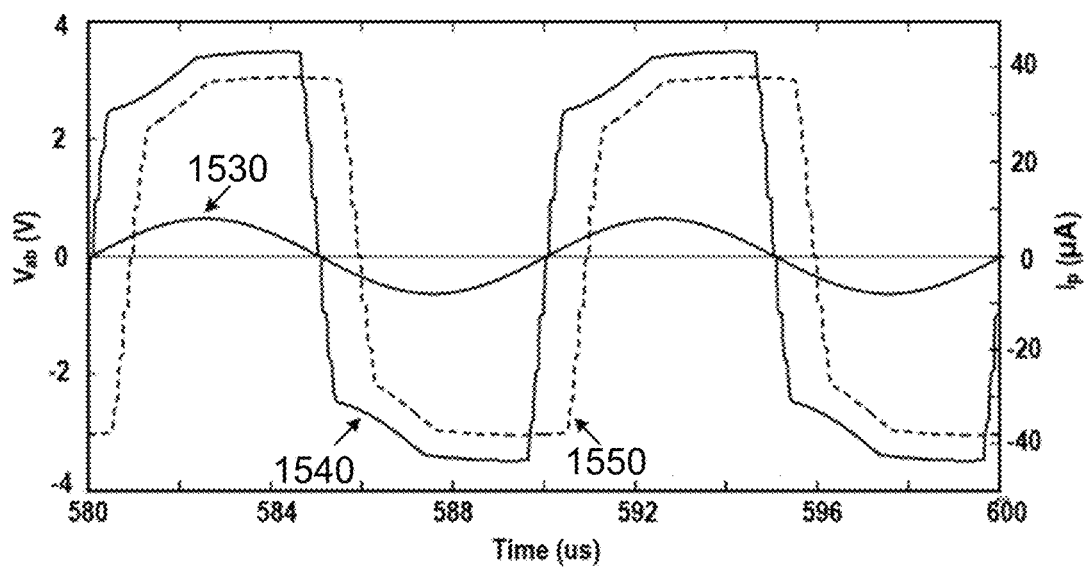
FIG. 15B shows a graph of zoom-in simulated PEH voltage with and without phase alignment during the steady state in accordance with an example embodiment.

FIG. 15B shows a graph 1500B of zoom-in simulated PEH voltage with and without phase alignment during the steady state in accordance with an example embodiment.

With reference to FIG. 6, FIGS. 15A and 15B provide the simulated PEH voltage during system startup and in the steady state. The PEH system initially operates with FCR turned off and is equivalent to an FBR implementation. After FCR turns on at 300 µs, the PEH output swing increases from 2.8 to 7 V due to the charge accumulation process. FIG. 15B illustrates the zoom-in of the same simulation from 580 to 600 µs, highlighting the PEH voltage difference with and without phase alignment. It can be observed that the loss due to phase misalignment (~1 µs in simulation) as a result of the comparator and logic delay can be significant, and a PEH voltage improvement from 6 to 7 V is achieved with phase alignment enabled. Based on simulations, the maximum output power of FBR and the FCR are 7.53 and 37.2 µW, respectively. This corresponds to a MOPIR of 4.94 times, which is lower than the theoretical value of 6.85 times. This difference is mainly due to the finite $t_{flip}$, as well as the losses due to the control overhead (i.e. phase generate-and-combine circuit and active rectifier), gate switching (i.e. switch drivers) and parasitic capacitances.

Figure 16:
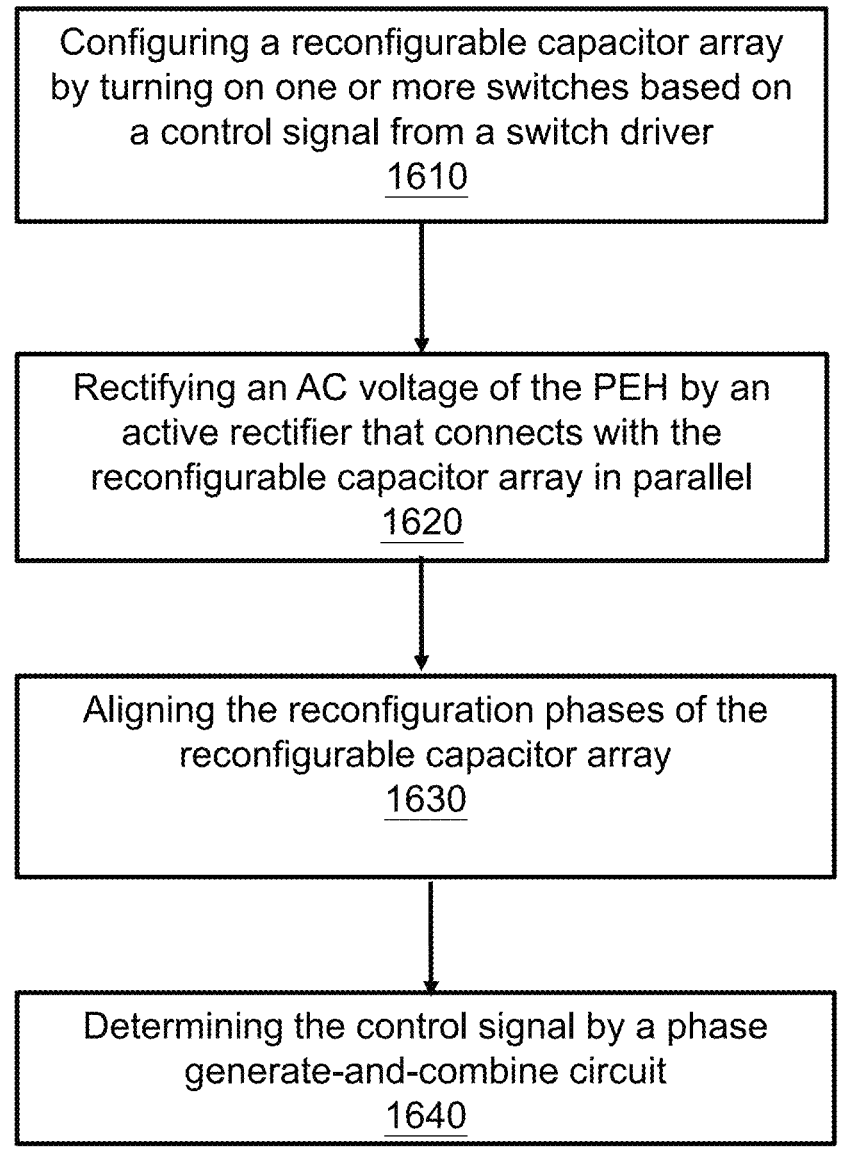
FIG. 16 shows a method executed by a flipping-capacitor rectifier circuit to harvest piezoelectric energy in accordance with an example embodiment.

FIG. 16 shows a method executed by a flipping-capacitor rectifier circuit to harvest piezoelectric energy in accordance with an example embodiment.

Block 1610 states configuring a reconfigurable capacitor array by turning on one or more switches based on a control signal from a switch driver.

Consider an example in which a flipping-capacitor rectifier circuit includes a reconfigurable capacitor array, an active rectifier, a switch driver and a phase generate-and-combine circuit. The switch driver connects with the reconfigurable capacitor array in series and turns on or turns off one or more of the switches of the reconfigurable capacitor array based on a control signal. The phase generate-and-combine circuit connects with the switch driver and the active rectifier in series and sends the control signal to the switch driver.

The flipping-capacitor rectifier circuit extracts power from the PEH and enhances the output power of the PEH. The reconfigurable capacitor array includes n flipping capacitors and M switches that are connected with the flipping capacitor.

The reconfigurable capacitor array is configured by turning on one or more of the switches based on a control signal from a switch driver. The flipping capacitors of the flipping capacitor array are connected with each other in parallel or in series to form (2n+1) reconfiguration phases by turning on one or more of the switches. Each of the configurations of the flipping capacitor array corresponds to a reconfiguration phase.

The reconfiguration phases include a sharing phase when charges in a capacitor of the PEH is redistributed to the flipping capacitors of the reconfigurable capacitor array, a shorting phase when the capacitor of the PEH is completely discharged, and a recharging phase when the capacitor of the PEH is recharged through the flipping capacitors.

The flipping-capacitor rectifier circuit enhances the output power of the PEH by a maximum output power improving rate (MOPIR). The MOPIR is higher when a number of the reconfiguration phases is higher. As one example, the flipping-capacitor rectifier circuit enhances the output power of the PEH by at least 4.5 times at an excitation frequency of 110 kHz when the reconfigurable capacitor array has 7 or more reconfiguration phases.

Block 1620 states rectifying an AC voltage of the PEH by an active rectifier that connects with the reconfigurable capacitor array in parallel.

Block 1630 states aligning the reconfiguration phases of the reconfigurable capacitor array.

By way of example, the active rectifier rectifies the voltage of the PEH and aligns reconfiguration phases of the reconfigurable capacitor array. The active rectifier performs ac-dc conversion and reduces the diode voltage drop. The active rectifier further reduces the equivalent diode drop to be less than 20 mV, which is less than 1% of the nominal $V_{rect}$ as shown in FIG. 6. A phase alignment control circuit is included in the active rectifier to reduce charge loss and power loss of the flipping-capacitor rectifier circuit due to a misalignment between the zero crossing of $I_p$ and the PEH shorting phase $\phi_0$.

Block 1640 states determining the control signal by a phase generate-and-combine circuit.

The phase generate-and-combine circuit connects with the switch driver and the active rectifier in series and sends the control signal to the switch driver and further to the reconfigurable capacitor array.

By way of example, the phase generate-and-combine circuit issues a control vector to the switch driver. A plurality of control signals are systematically processed to obtain the control vector and are phase combined. The required phases are a group of non-overlapping successive pulses. A pulse generator regulates the pulse width and delays of the control vector for complete charge transfer with non-overlapping pulse generation.

Multi-phase pulses are generated by combining multiple controls using the phase generate-and-combine circuit, to reduce redundant switching activities through simple digital logics. The digital logics in the phase generate-and-control circuit perform a phase combining operation to reduce redundant switching activities of the switches. The phase generate-and-combine circuit reduces the total number of pulses, which leads to a gate driving activity reduction by 41.5%.

Figure 17A:
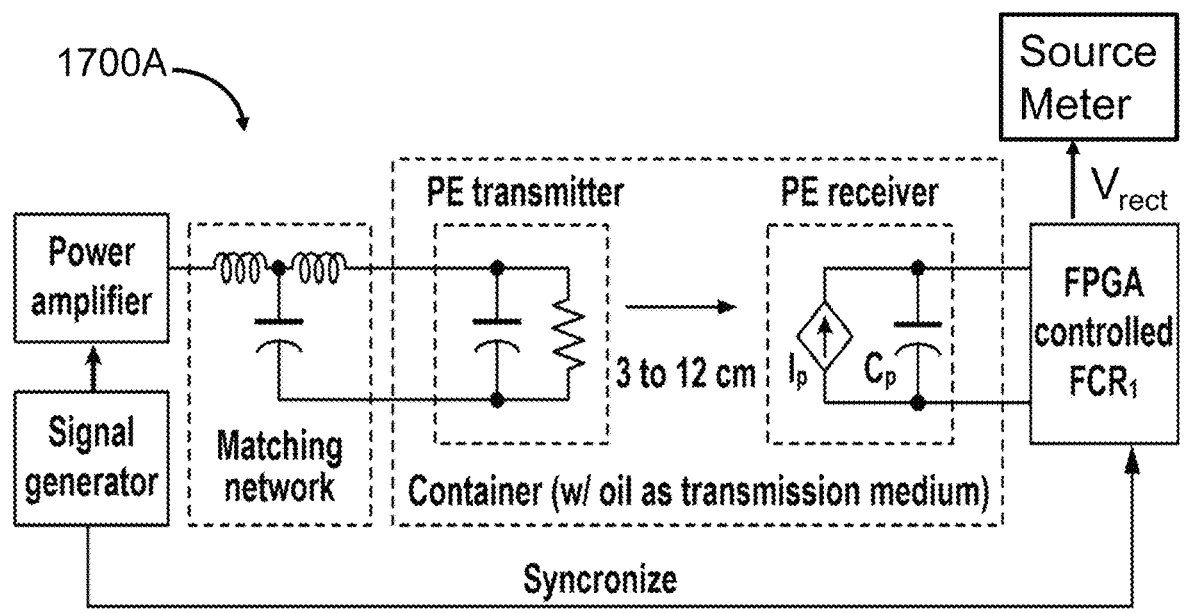
FIG. 17A shows a block diagram for a measurement setup in accordance with an example embodiment.

FIG. 17A shows a block diagram 1700A for a measurement setup in accordance with an example embodiment.

Figure 17B:
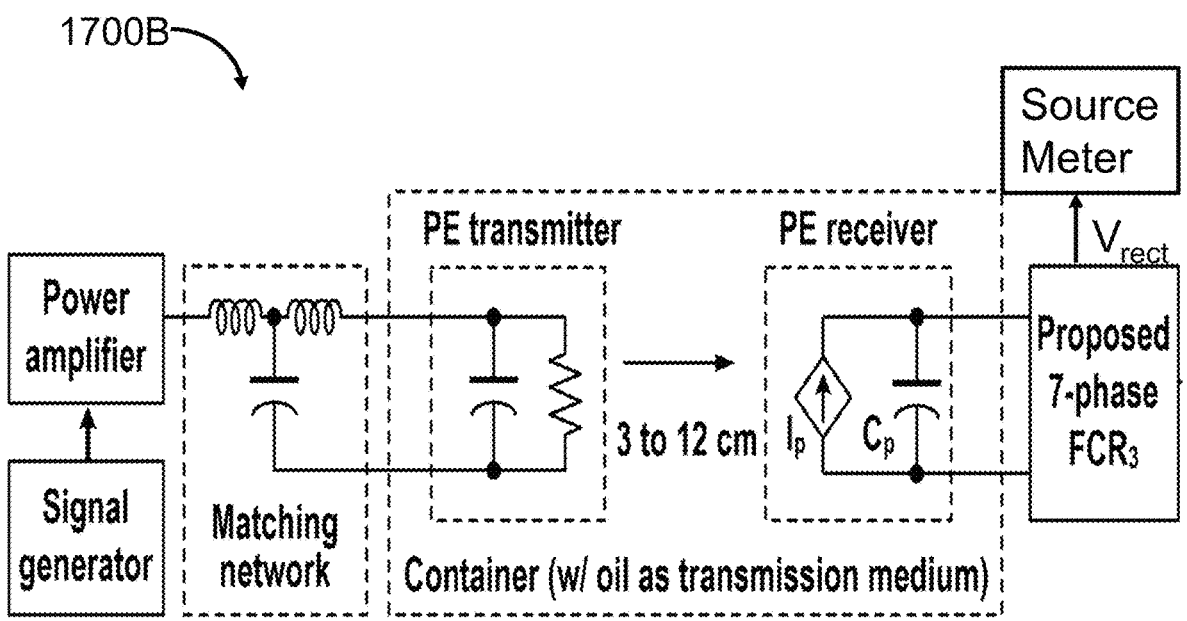
FIG. 17B shows a block diagram for a measurement setup in accordance with another example embodiment.

FIG. 17B shows a block diagram 1700B for a measurement setup in accordance with another example embodiment.

FIG. 17A and FIG. 17B outline the system measurement setup. A sinusoidal wave generated by the signal generator Agilent 33220A is amplified by the power amplifier ENI240L. The PSI-5A4E serves as both the transmitter (76.4×76.4×5 mm³) and the receiver (1×1×5 mm³). Impedance matching between the power amplifier and the transmitter is achieved by the matching network. An oil material is selected as the transmission medium due to its high electrical impedance.

A flipping-capacitor rectifier circuit with one flipping capacitor and five switches is represented by $FCR_1$. $FCR_1$ with discrete components is characterized by the setup as shown in FIG. 17A. The signal generator controls both the FPGA and the power amplifier for synchronization to ensure proper phase alignment at the zero crossing of $I_p$. A plurality of transistors serve as the configuration switches, to ensure negligible switch conductance. The active rectifier in FIGS. 17A and 17B is fabricated by the 0.18-μm 1.8/3.3/6V CMOS process, which exhibits a measured diode drop of <40 mV.

A fully-integrated $FCR_3$ chip prototype fabricated by a 0.18-μm 1.8/3.3/6V CMOS process, as discussed in FIGS. 6 to 15, is characterized by the setup as shown in FIG. 17B. In both setups of FIGS. 17A and 17B, the excitation signal from the power amplifier is set to 110 kHz with amplitude of 20 V unless otherwise stated.

To achieve a small system volume, the PEH is designed with a size of 1×1×5 mm³. The PEH is characterized by a precision impedance analyzer (Agilent 4294A) through independently accessing the PEH electrodes.

Figure 18:
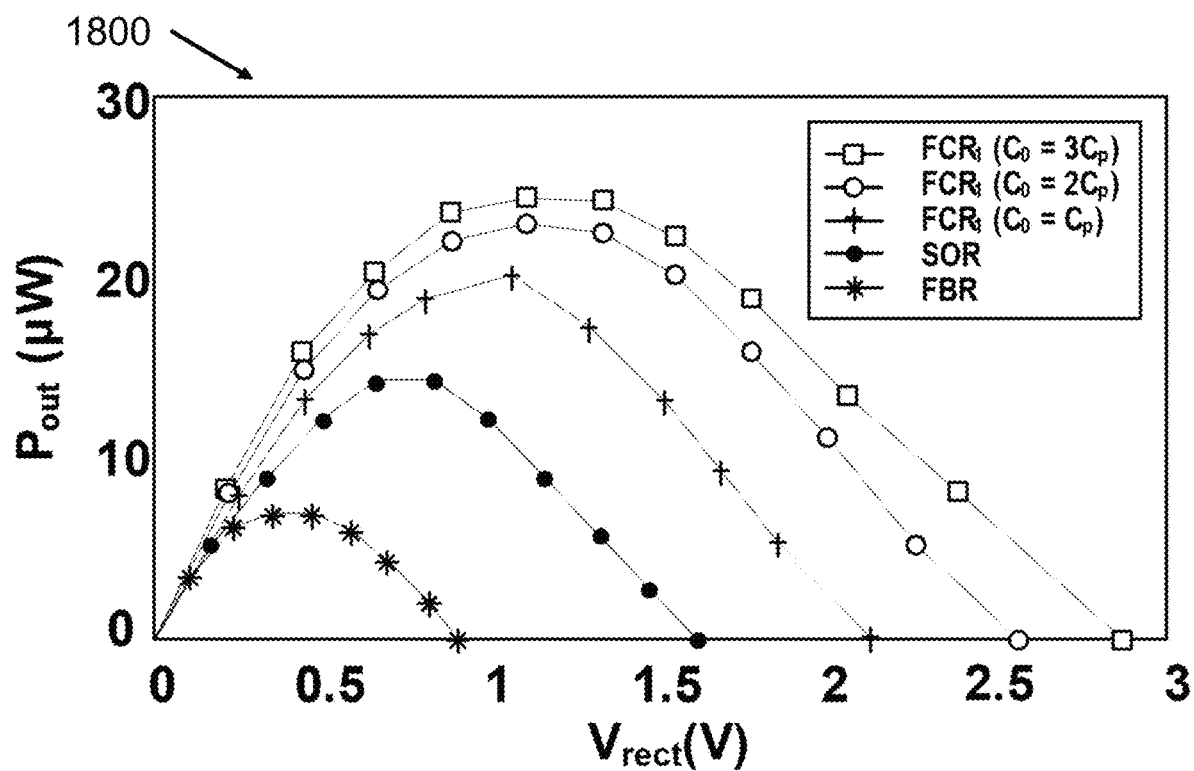
FIG. 18 shows a graph of measured output power of a PEH system in accordance with an example embodiment.

FIG. 18 shows a graph 1800 of measured output power of a PEH system in accordance with an example embodiment. It shows the measured $FCR_1$ output power with respect to $V_{rect}$ with different $C_{total}$. It is demonstrated that an increased output power is achieved when compared with FBR and SOR using the same measurement settings, and the achieved MOPIR with $C_{total}$=80, 160 and 240 pF are 2.9, 3.3 and 3.4, respectively, without including the losses due to the control circuit and the active rectifier. The obtained MOPIR results are close to the theoretical values of 3, 3.33 and 3.5.

Figure 19:
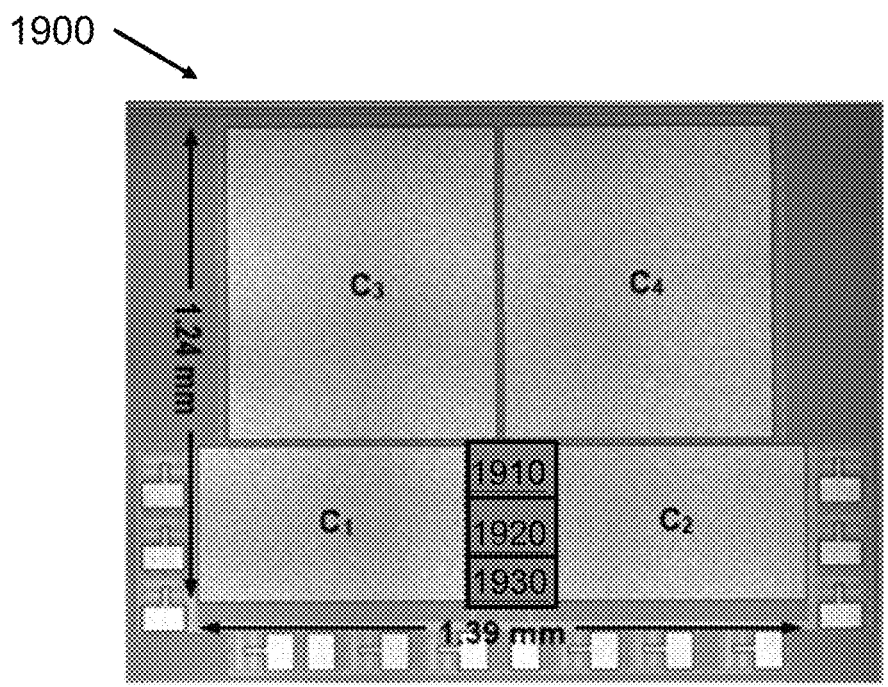
FIG. 19 shows a chip of a flipping-capacitor rectifier circuit in accordance with an example embodiment.

FIG. 19 shows a chip 1900 of a flipping-capacitor rectifier circuit in accordance with an example embodiment.

As shown in FIG. 19, a prototype chip is fabricated in a standard 0.18-μm 1.8/3.3/6V CMOS process, occupying an active area of 1.24×1.39 mm². The chip is a reconfigurable flipping capacitor array that includes four flipping capacitors $C_1$, $C_2$, $C_3$, and $C_4$. For example, the capacitance of $C_1$ and $C_2$ is 240 pF, and the capacitance of $C_3$ and $C_4$ is 480 pF. The area of the four capacitors dominates the chip area (84.7%). The chip includes a switch driver 1910, a phase generator 1920 and an active rectifier 1930.

Figure 20:
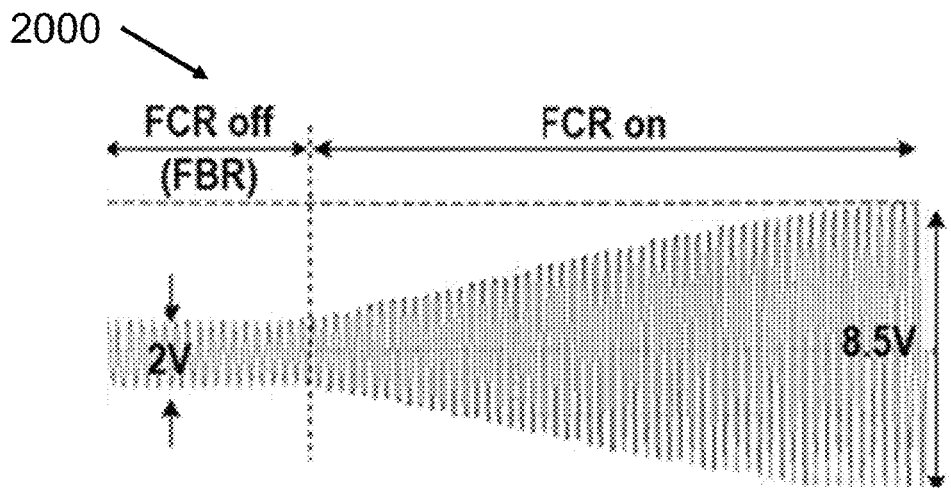
FIG. 20 shows measured PEH voltage in accordance with an example embodiment.

FIG. 20 shows measured PEH voltage 2000 in accordance with an example embodiment. It shows the PEH voltage of the $FCR_3$ during system startup. It is observed that the PEH voltage increases from 2V to 8.5V.

Figure 21A:
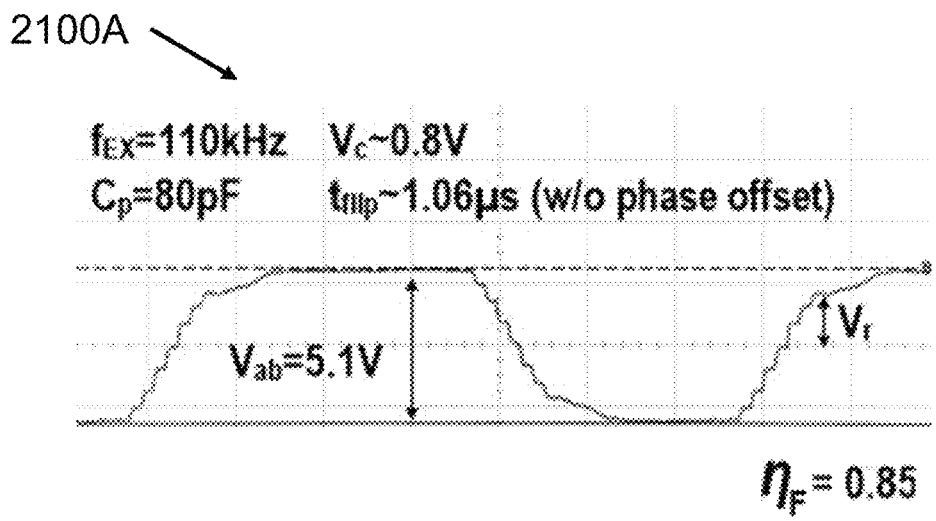
FIG. 21A shows measured PEH voltage without phase alignment in accordance with an example embodiment.

FIG. 21A shows measured PEH voltage 2100A without phase alignment in accordance with an example embodiment.

Figure 21B:
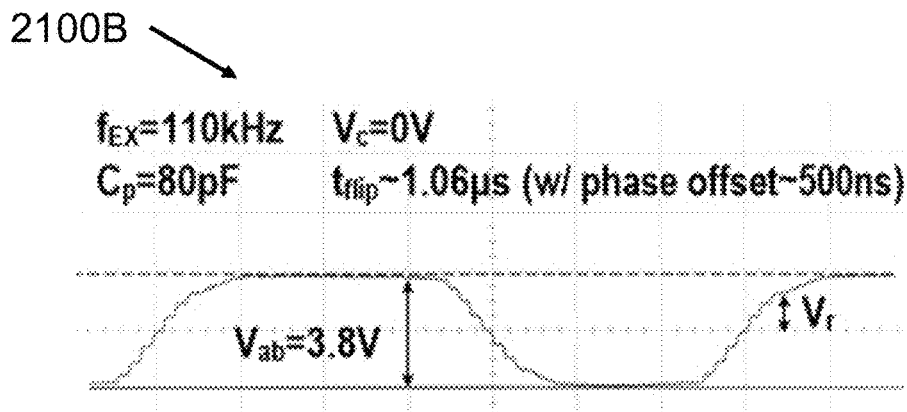
FIG. 21B shows measured PEH voltage with phase alignment in accordance with an example embodiment.

FIG. 21B shows measured PEH voltage 2100B with phase alignment in accordance with an example embodiment.

FIGS. 21A and 21B compares the PEH voltage waveforms with and without phase alignment (through controlling $V_c$). With phase alignment, the voltage swing increases from 3.84 V and 5.1 V (with a pulse width of 234 ns), leading to a measured $\eta_F$ of 0.85. By controlling $C_{<0,1>}$, we also measured the $FCR_3$ performance with different pulse widths. The corresponding PEH voltages are 4.47, 5.03 and 4.94 V when the pulse widths are 357, 256 and 196 ns, respectively.

Figure 22:
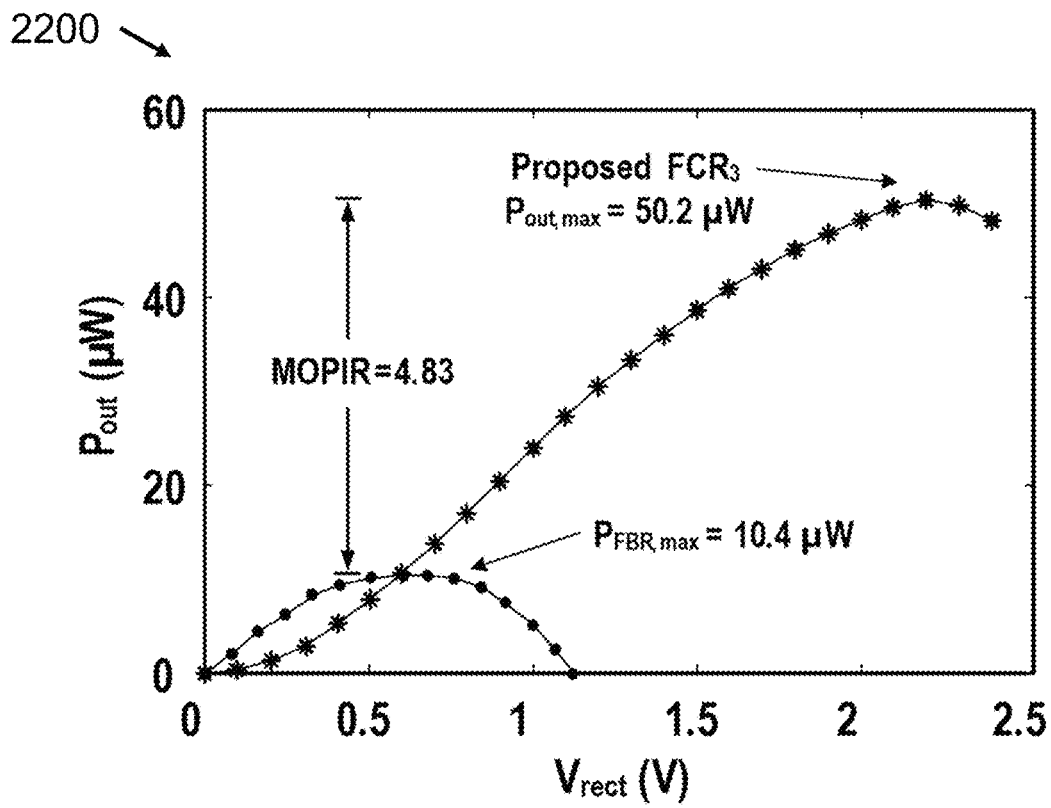
FIG. 22 shows measured output power of a PEH system in accordance with an example embodiment.

FIG. 22 shows measured output power 2200 of a PEH system in accordance with an example embodiment.

FIG. 22 plots the measured $FCR_3$ output power versus different $V_{rect}$, showing the output power achieved by FBR as well. The FBR achieves a maximum power output of 10.4 μW at $V_{rect}$=0.8 V. With $FCR_3$, the maximum output power increases to 50.2 μW, leading to a MOPIR of 4.83. For $V_{rect}$ lower than 0.6 V, the output power of $FCR_3$ is lower than that of FBR due to the performance degradation of the active rectifier at a low supply voltage.

Figure 23:
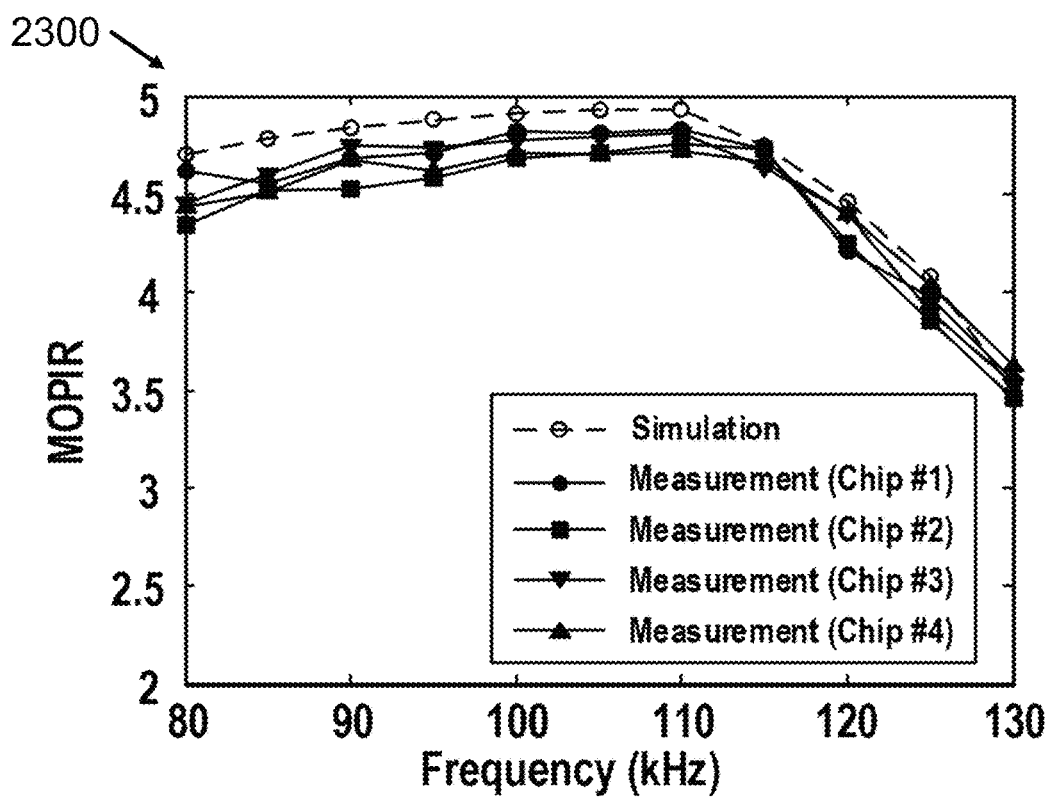
FIG. 23 shows simulated MOPIR and measured MOPIR at different excitation frequencies in accordance with an example embodiment.

FIG. 23 shows a graph 2300 of simulated MOPIR and measured MOPIR at different excitation frequencies in accordance with an example embodiment. It shows MOPIR versus different frequencies from 4 samples. The $FCR_3$ achieves a MOPIR of more than 3.5 from 80 to 130 kHz. The drop in the MOPIR at high frequency is mainly caused by the reduced conduction time. At low frequency, the slight drop in MOPIR is due to the increased gate switching loss as a result of increased driving voltage.

Figure 24A:
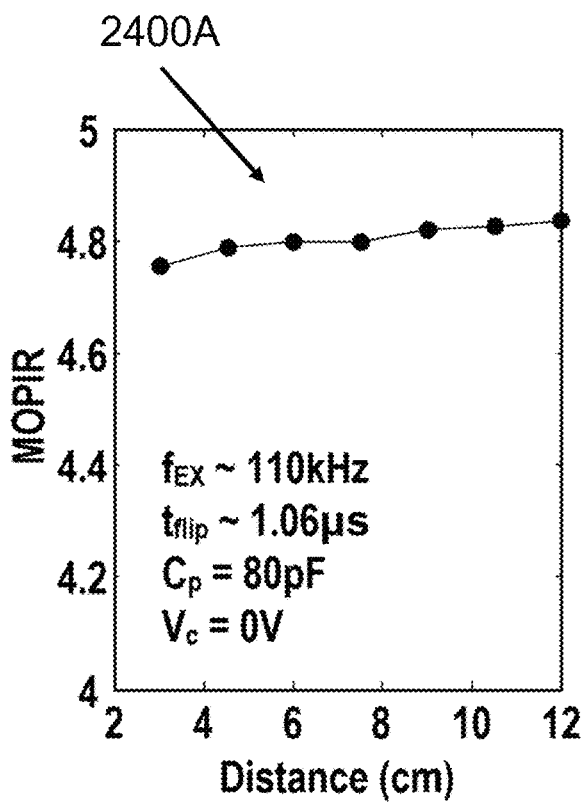
FIG. 24A shows measured MOPIR versus distances in accordance with an example embodiment.

FIG. 24A shows a graph 2400A of measured MOPIR versus distances in accordance with an example embodiment. It shows the measured MOPIR versus the distance between the transmitter and the receiver. Even though a reduced $V_{rect}$ is observed during the measurement as the distance increases, the MOPIR remains roughly at 4.8.

Figure 24B:
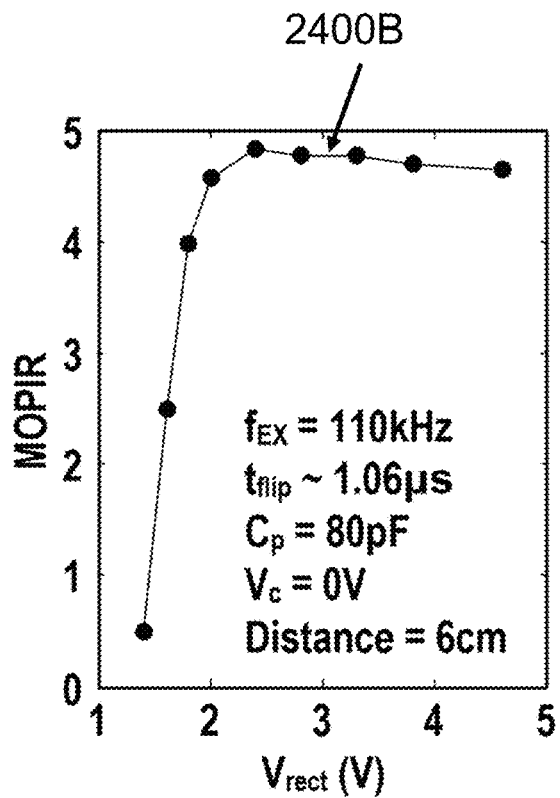
FIG. 24B shows measured MOPIR at different voltages in accordance with an example embodiment.

FIG. 24B shows a graph 2400B of measured MOPIR at different voltages in accordance with an example embodiment. It shows the measured MOPIR versus different $V_{rect}$, and the MOPIR can be maintained with a value higher than 4.5 with $V_{rect}$>2 V. At $f_{EX}$=110 kHz, the active rectifier and switch driver dissipates a power of ~8.5 µW and ~6.4 µW while delivering an output power of 50.2 µW, respectively.

Figure 25:
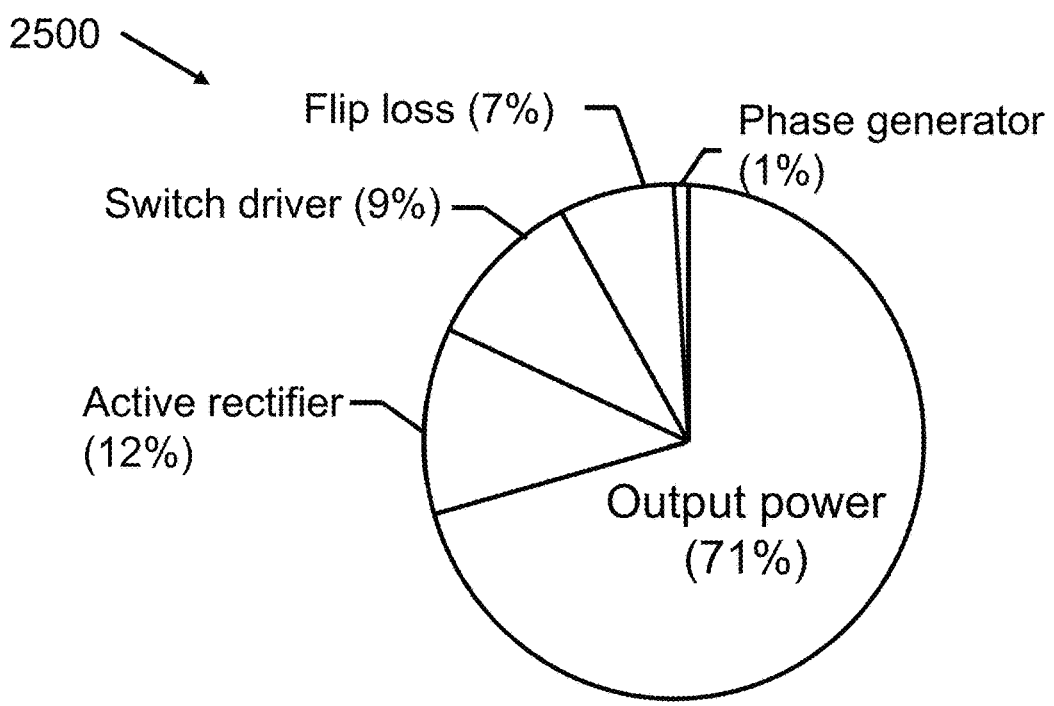
FIG. 25 shows a distribution of measured power in accordance with an example embodiment.

FIG. 25 shows a chart 2500 of a distribution of measured power in accordance with an example embodiment. It summarizes the measured power breakdown. The $FCR_3$ achieves a system efficiency of 71%, with 12%, 9% and 1% consumed by the active rectifier, switch driver and phase generate-and-combine circuit, respectively. The flip loss, which includes all the intrinsic losses due to capacitor reconfigurations during the finite $t_{flip}$, contributes to roughly 7%.

As used herein, a "flipping-capacitor rectifier circuit" is a rectifier circuit that can flip the polarity of the PEH voltage by reconfiguring a plurality of flipping capacitors and provide a rectified output voltage.

As used herein, a "flipping capacitor" is a capacitive energy storage element which involves in reversing the PEH polarity through reconfigurations.

As used herein, a "reconfiguration phase" is a particular configuration phase of the flipping capacitors after reconfigurations to realize the flipping operations of the flipping capacitors to invert the PEH polarity.

The systems and methods in accordance with example embodiments are provided as examples, and examples from one system or method should not be construed to limit examples from another system or method. Further, methods discussed within different figures can be added to or exchanged with methods in other figures. Further yet, specific numerical data values (such as specific quantities, numbers, categories, etc.) or other specific information should be interpreted as illustrative for discussing example embodiments. Such specific information is not provided to limit example embodiments.

What is claimed is:

1. A flipping-capacitor rectifier circuit that enhances an output power of a piezoelectric energy harvester (PEH), comprising:
   a reconfigurable capacitor array that includes n flipping capacitors and M switches, wherein the flipping capacitors are connected with each other in parallel or in series to form P configurations by turning on one or more of the switches, each of the configurations corresponding to a reconfiguration phase;
   an active rectifier that connects with the reconfigurable capacitor array in parallel, rectifies an AC voltage of the PEH, and aligns the reconfiguration phases of the reconfigurable capacitor array;
   a switch driver that connects with the reconfigurable capacitor array in series and turns on one or more of the switchers of the reconfigurable capacitor array based on a control signal; and
   a phase generate-and-combine circuit that connects with the switch driver and the active rectifier in series and sends the control signal to the switch driver,
   wherein n is an integer greater or equal to 1, and M and P are integers greater or equal to 3; and wherein the active rectifier includes a phase alignment control circuit to reduce power loss of the flipping-capacitor rectifier circuit and a common-gate comparator to reduce a diode voltage drop to less than 20 mV.

2. The flipping-capacitor rectifier circuit of claim 1, wherein the reconfiguration phases include a sharing phase when charges in a capacitor of the PEH are redistributed to the flipping capacitors of the reconfigurable capacitor array, a shorting phase when the capacitor of the PEH is completely discharged, and a recharging phase when the capacitor of the PEH is recharged through the flipping capacitors.

3. The flipping-capacitor rectifier circuit of claim 1, wherein the switch driver includes a plurality of level converters to turn on and off the switches of the reconfigurable capacitor array.

4. The flipping-capacitor rectifier circuit of claim 1, wherein the phase generate-and-combine circuit minimizes redundant switching activities by combining multiple controls through digital logics.

5. The flipping-capacitor rectifier circuit of claim 1 enhances the output power of the PEH by at least 4.5 times at an excitation frequency of 110 kHz when the reconfigurable capacitor array has 7 or more reconfiguration phases.

6. The flipping-capacitor rectifier circuit of claim 1 enhances the output power of the PEH by a maximum output power improving rate (MOPIR), wherein the MOPIR is determined by a number of the reconfiguration phases, and the MOPIR is higher with a higher number of the reconfiguration phases.

7. A method executed by a flipping-capacitor rectifier circuit that enhances an output power of a piezoelectric energy harvester (PEH), comprising:
   configuring, by the flipping-capacitor rectifier circuit, a reconfigurable capacitor array that includes n flipping capacitors and M switches by turning on one or more of the switches based on a control signal from a switch driver, wherein the flipping capacitors are connected with each other to form P reconfiguration phases;
   rectifying, by an active rectifier that connects with the reconfigurable capacitor array in parallel, an AC voltage of the PEH;
   aligning, by the active rectifier, the reconfiguration phases of the reconfigurable capacitor array; and
   determining, by a phase generate-and-combine circuit that connects with the switch driver and the active rectifier in series, the control signal that is sent from the switch driver to the reconfigurable capacitor array of the flipping-capacitor rectifier circuit,
   wherein n is an integer greater or equal to 1, and M and P are integers greater or equal to 3; and wherein the active rectifier includes a phase alignment control circuit to reduce power loss of the flipping-capacitor rectifier circuit;
   the method further comprising:
   reducing, by the active rectifier, a diode voltage drop to less than 20 mV through the phase alignment control circuit.

8. The method of claim 7, wherein the reconfiguration phases include a sharing phase when charges in a capacitor of the PEH is redistributed to the flipping capacitors of the reconfigurable capacitor array, a shorting phase when the capacitor of the PEH is completely discharged, and a recharging phase when the capacitor of the PEH is recharged through the flipping capacitors.

9. The method of claim 7, wherein the flipping-capacitor rectifier circuit enhances the output power of the PEH by a maximum output power improving rate (MOPIR), wherein the MOPIR is higher when a number of the reconfiguration phases is higher.

10. The method of claim 7, further comprising:
  performing, by digital logics in the phase generate-and-control circuit, a phase combining operation to reduce redundant switching activities of the switches.

* * * * *